(12) United States Patent
Saito et al.

(10) Patent No.: US 8,575,615 B2
(45) Date of Patent: Nov. 5, 2013

(54) SEMICONDUCTOR DEVICE

(75) Inventors: Yuichi Saito, Osaka (JP); Masao Moriguchi, Osaka (JP); Tokuo Yoshida, Osaka (JP); Yasuaki Iwase, Osaka (JP); Yohsuke Kanzaki, Osaka (JP); Mayuko Sakamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/119,210

(22) PCT Filed: Sep. 1, 2009

(86) PCT No.: PCT/JP2009/004288
§ 371 (c)(1),
(2), (4) Date: Mar. 16, 2011

(87) PCT Pub. No.: WO2010/032386
PCT Pub. Date: Mar. 25, 2010

(65) Prior Publication Data
US 2011/0169005 A1    Jul. 14, 2011

(30) Foreign Application Priority Data

Sep. 17, 2008   (JP) ................................. 2008-238485

(51) Int. Cl.
| H01L 31/00 | (2006.01) |
| H01L 29/10 | (2006.01) |
| H01L 29/04 | (2006.01) |
| H01L 31/036 | (2006.01) |

(52) U.S. Cl.
USPC ................. 257/72; 257/59; 257/69

(58) Field of Classification Search
USPC ............................ 257/57, 59, 72, E29.003, 69
See application file for complete search history.

(56) References Cited

U.S. PATENT DOCUMENTS

| 5,686,349 A | 11/1997 | Nakata |
| 6,392,622 B1 | 5/2002 | Ozawa |

(Continued)

FOREIGN PATENT DOCUMENTS

| JP | 59-16378 A | 1/1984 |
| JP | 59-143358 A | 8/1984 |

(Continued)

OTHER PUBLICATIONS

English translation of Official Communication issued in corresponding International Application PCT/JP2009/004288, mailed on Apr. 28, 2011.

(Continued)

Primary Examiner — Walter H Swanson
Assistant Examiner — Wilner Jean Baptiste
(74) Attorney, Agent, or Firm — Keating & Bennett, LLP

(57) ABSTRACT

A diode 201 includes a gate electrode 2, a gate insulating layer 5 provided on the gate electrode 2, at least one semiconductor layer 6, 7 provided on the gate insulating layer 5 and which includes a first region 6a and a second region 7b, a first electrode 10 which is provided on the first region 6a and which is electrically coupled to the first region 6a and the gate electrode 2, and a second electrode 12 which is provided on the second region 7b and which is electrically coupled to the second region 7b. The at least one semiconductor layer 6, 7 includes a channel region 6c which extends above the gate electrode 2 with the intervention of the gate insulating layer 5 therebetween, and a resistor region 7d which does not extend above the gate electrode 2. When the diode 201 is in an ON state, an electric current path is formed between the first electrode 10 and the second electrode 12, the electric current path including the channel region 6c and the resistor region 7d.

12 Claims, 24 Drawing Sheets

(56) References Cited

U.S. PATENT DOCUMENTS

| | | |
|---|---|---|
| 6,627,952 B1 | 9/2003 | Wollesen |
| 7,126,268 B2* | 10/2006 | Kitazawa ............... 313/500 |
| 2001/0045996 A1 | 11/2001 | Kawai et al. |
| 2003/0201442 A1* | 10/2003 | Makita .................. 257/66 |
| 2005/0088387 A1 | 4/2005 | Yokoyama et al. |
| 2006/0208275 A1* | 9/2006 | Yun ....................... 257/147 |
| 2007/0012926 A1* | 1/2007 | Hong et al. ............ 257/72 |

FOREIGN PATENT DOCUMENTS

| | | |
|---|---|---|
| JP | 61-79258 A | 4/1986 |
| JP | 5-304171 A | 11/1993 |
| JP | 6-196701 A | 7/1994 |
| JP | 10-20336 A | 1/1998 |
| JP | 11-231345 A | 8/1999 |
| JP | 2002-76356 A | 3/2002 |
| JP | 2005-115342 A | 4/2005 |
| JP | 2007-212711 A | 8/2007 |
| JP | 2008-177466 A | 7/2008 |
| JP | 2008-193101 A | 8/2008 |

OTHER PUBLICATIONS

Xu et al., "A Novel Thin-film Transistors With μc-Si/a-Si Dual Active Layer Structure for AM-LCD", IDW '96 Proceedings of the Third International Display Workshops, vol. 1, Nov. 27-29, 1996, Kobe, Japan, pp. 117-120.

Lee et al., "42.2: World's Largest (15-inch) XGA AMLCD Panel Using IGZO Oxide TFT", SID 08 Digest, US, Society for Information Display, 2008, vol. 39, 1st edition, pp. 625-628.

Kim et al., "42.1: A Novel Four-Mask-Count Process Architecture for TFT-LCDs", SID 2000 Digest, pp. 1006-1009.

* cited by examiner

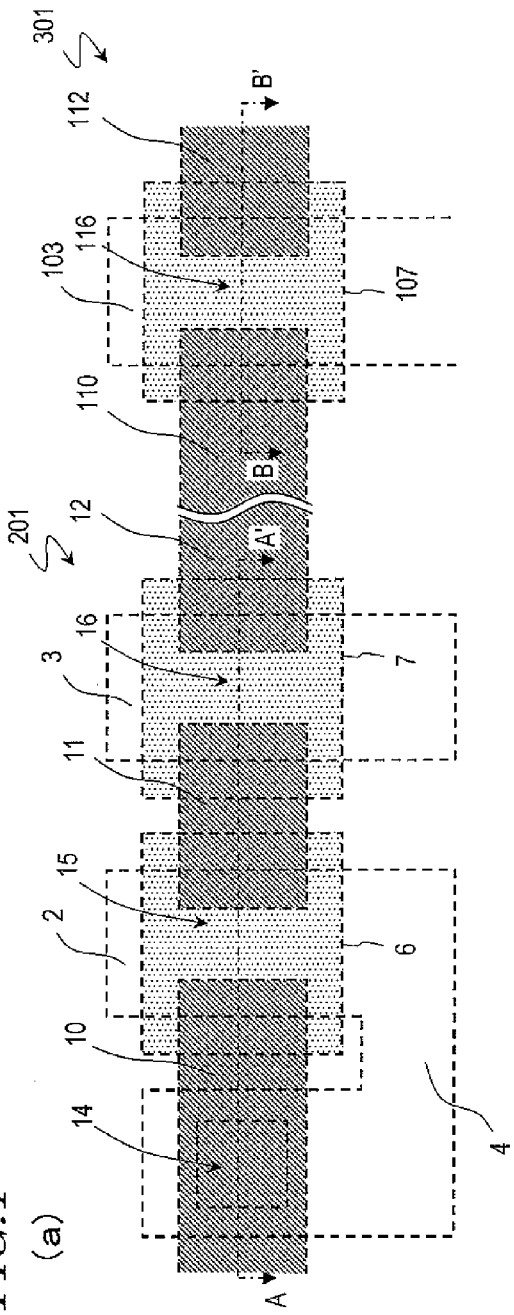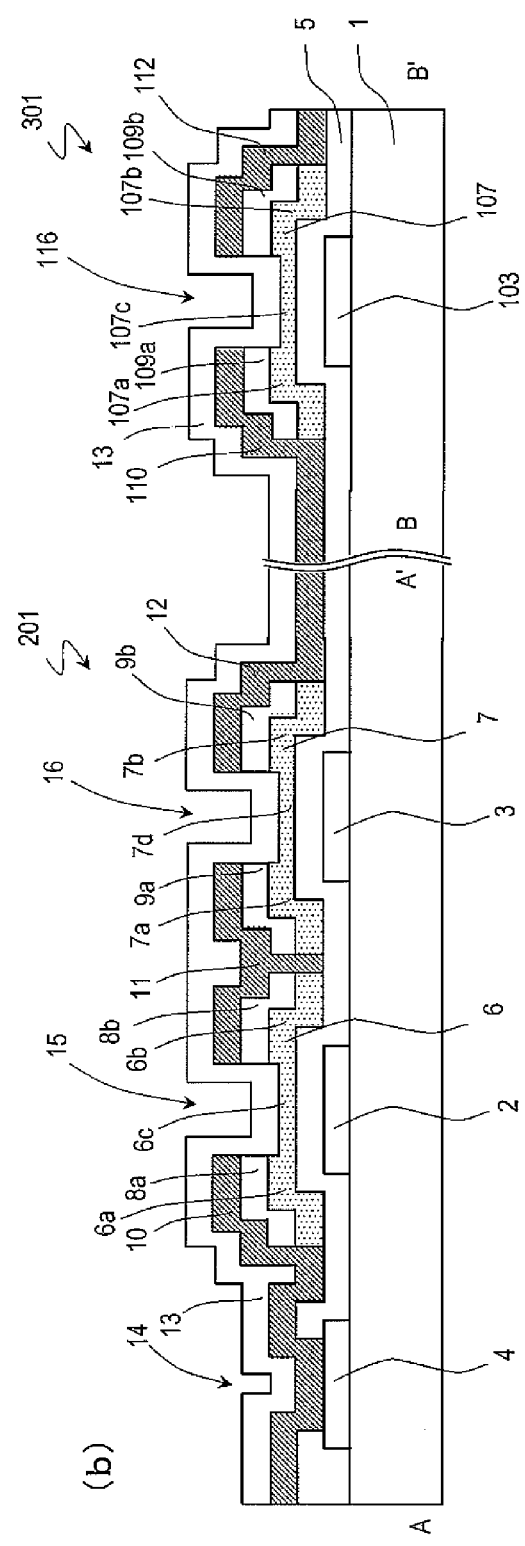
FIG.1

FIG.5
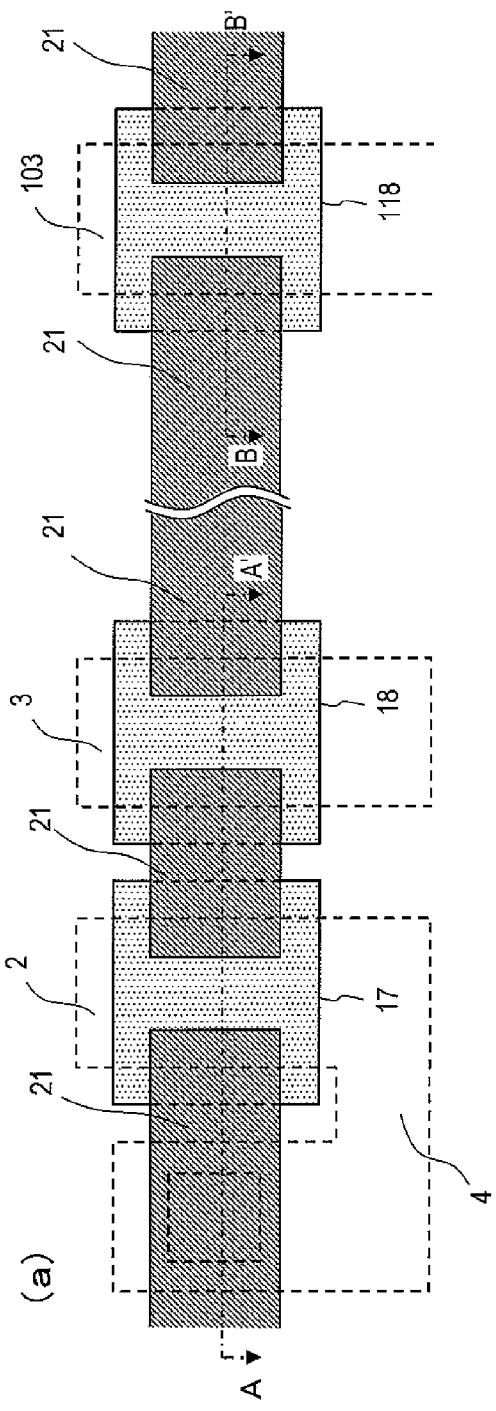
(a)
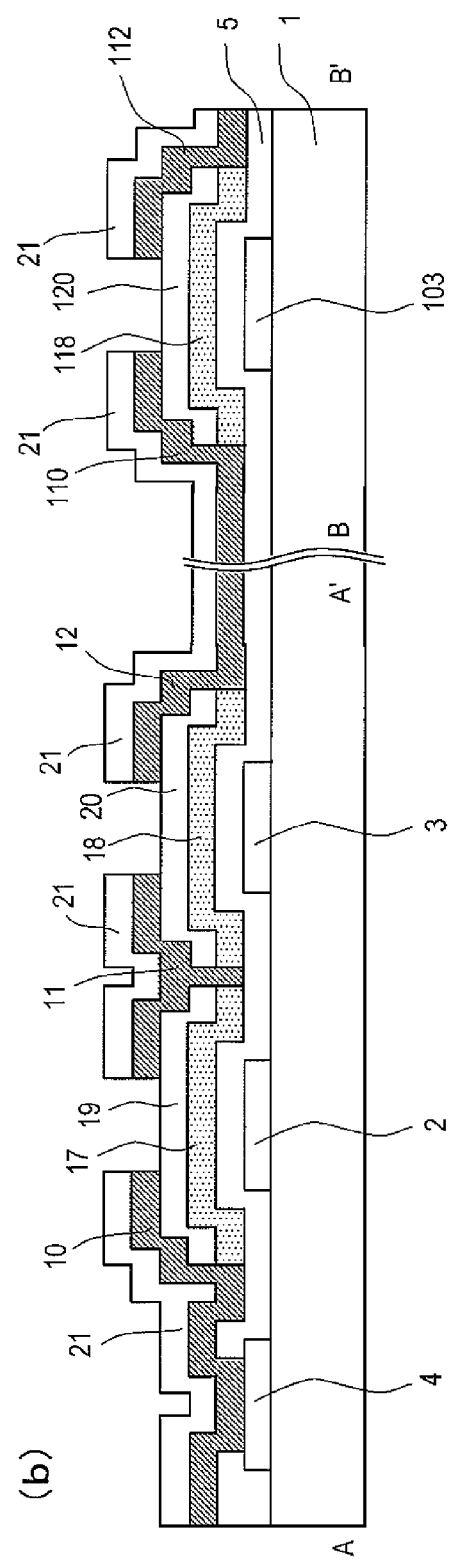
(b)

FIG. 7
(a)
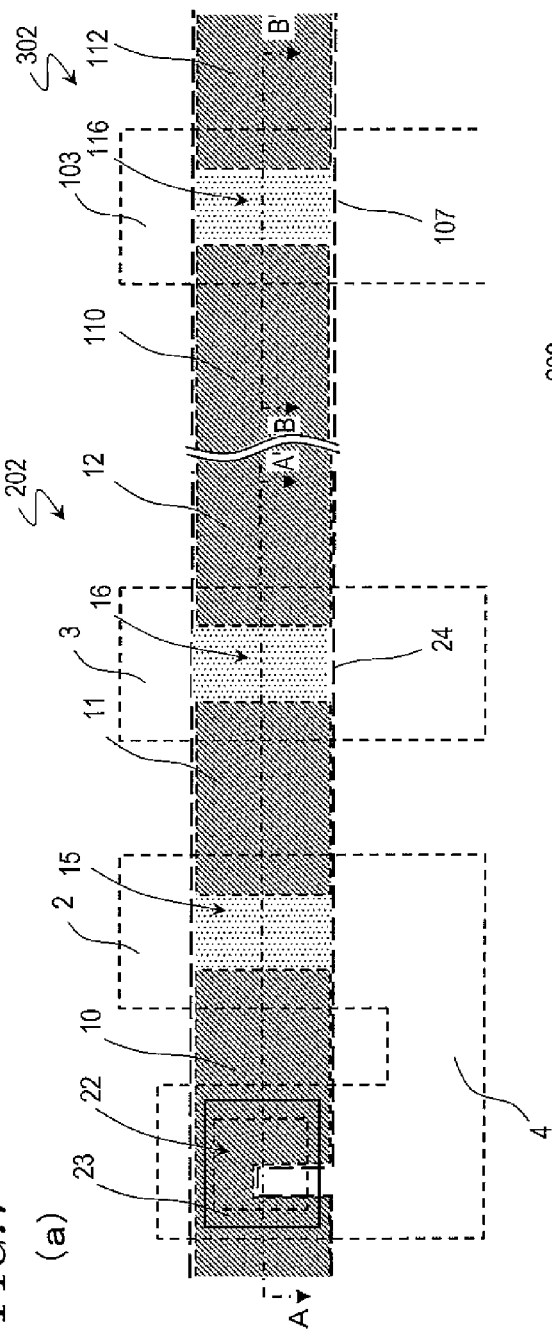
(b)
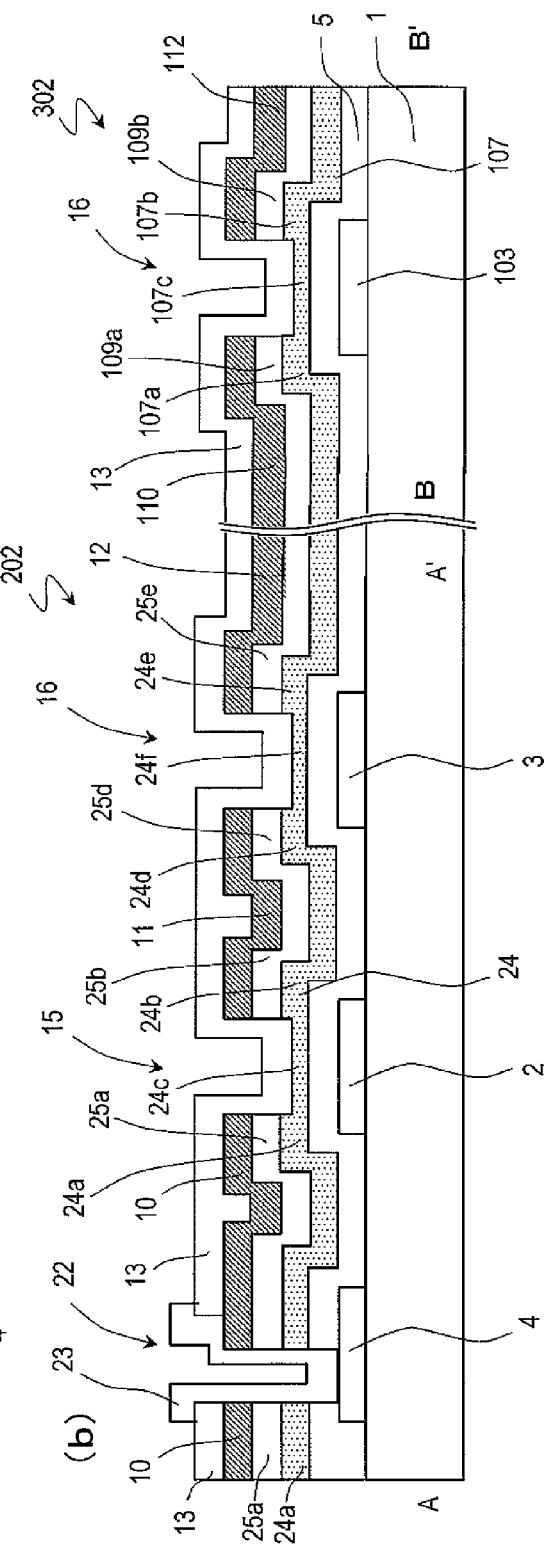

FIG.10
(a)
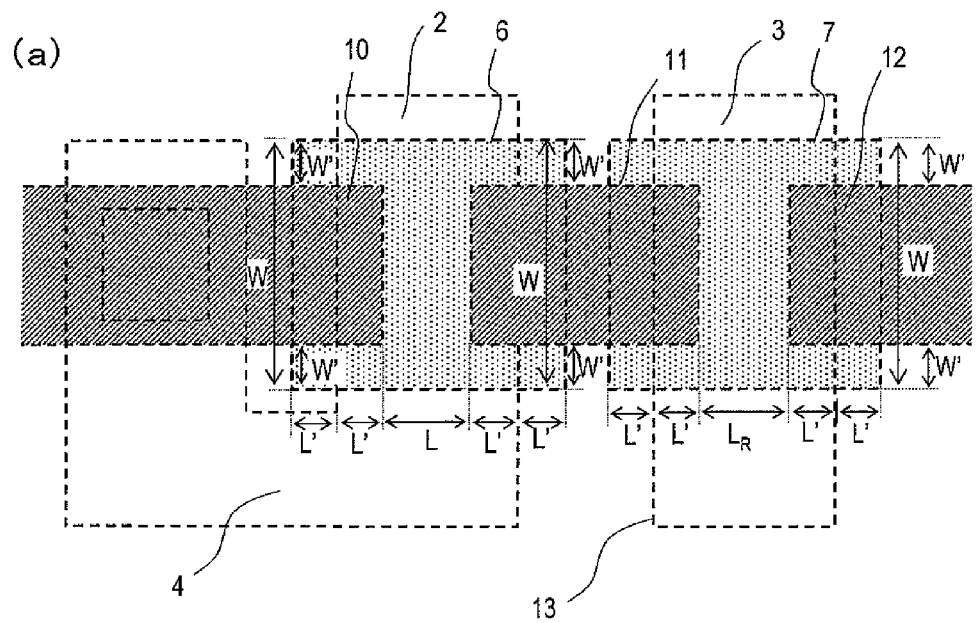
(b)
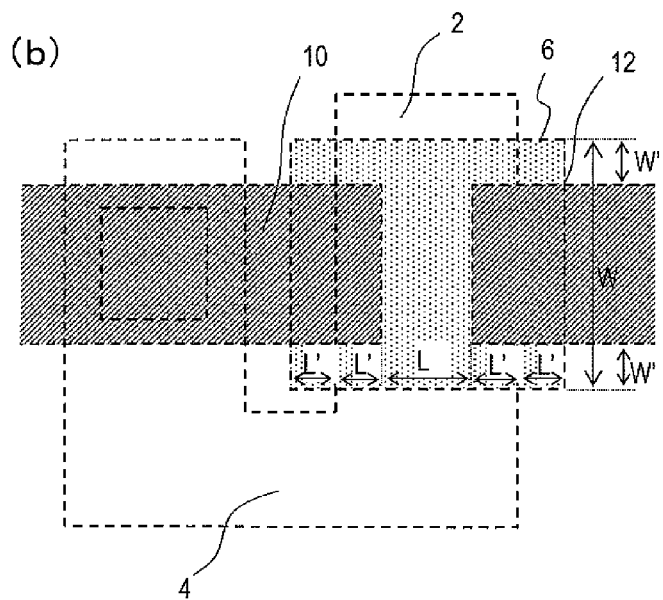

FIG.11
(a)
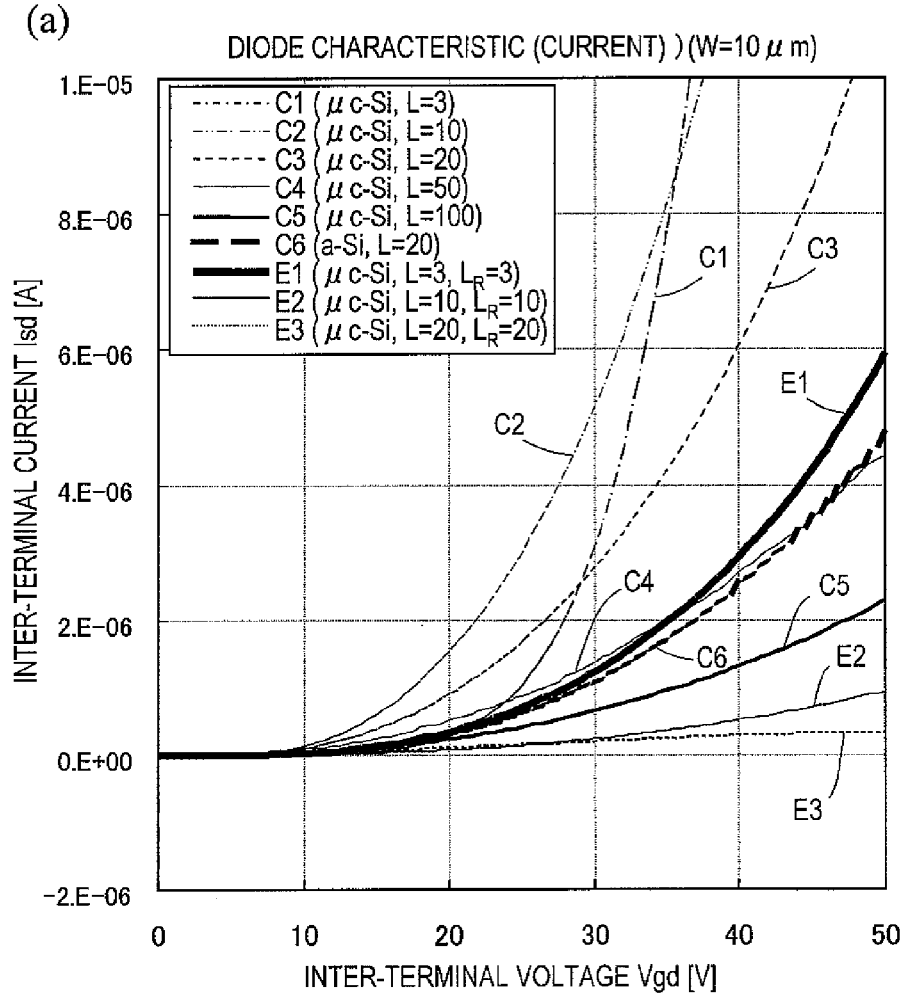
(b) C1~C6
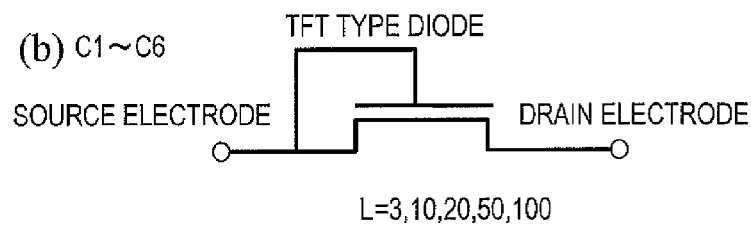
(c) E1~E3
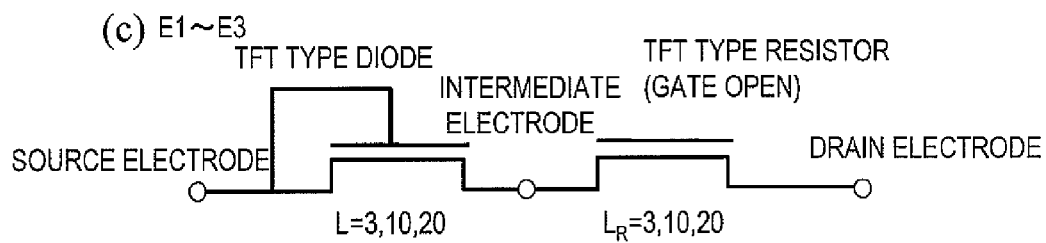

FIG.13
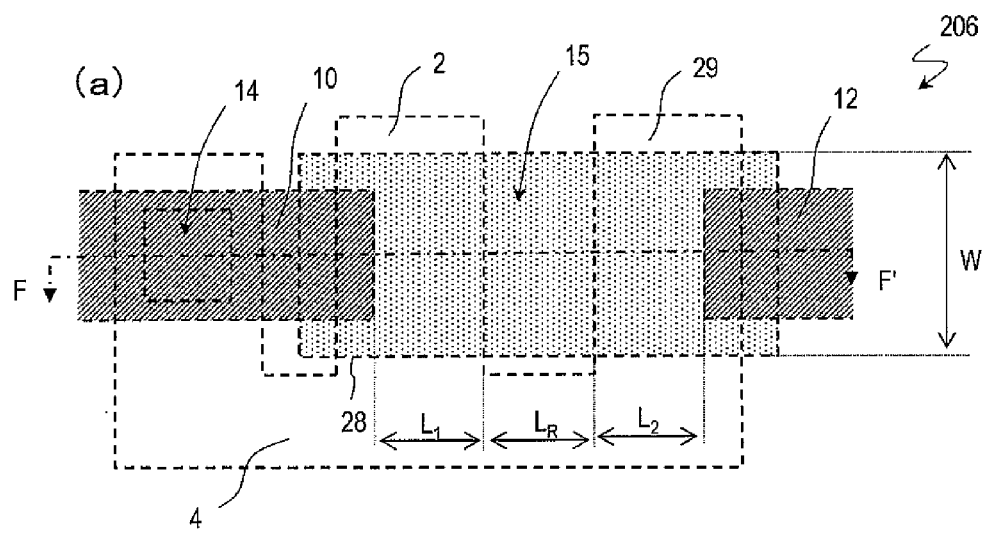
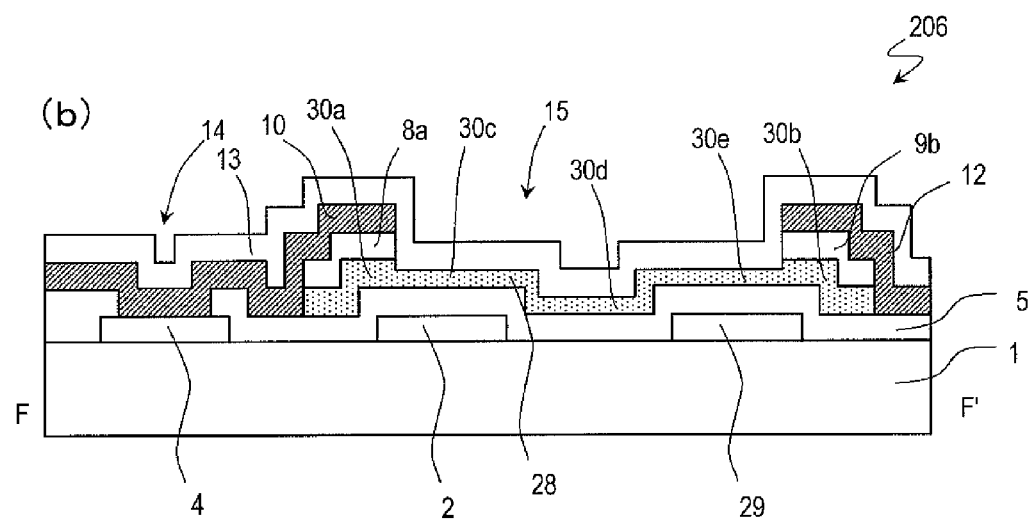

FIG.16
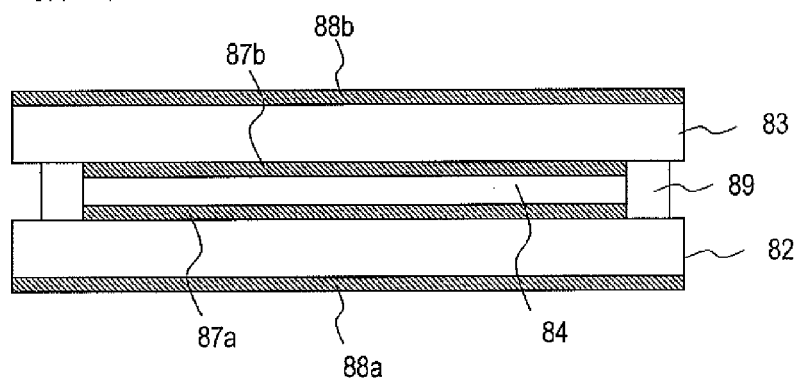
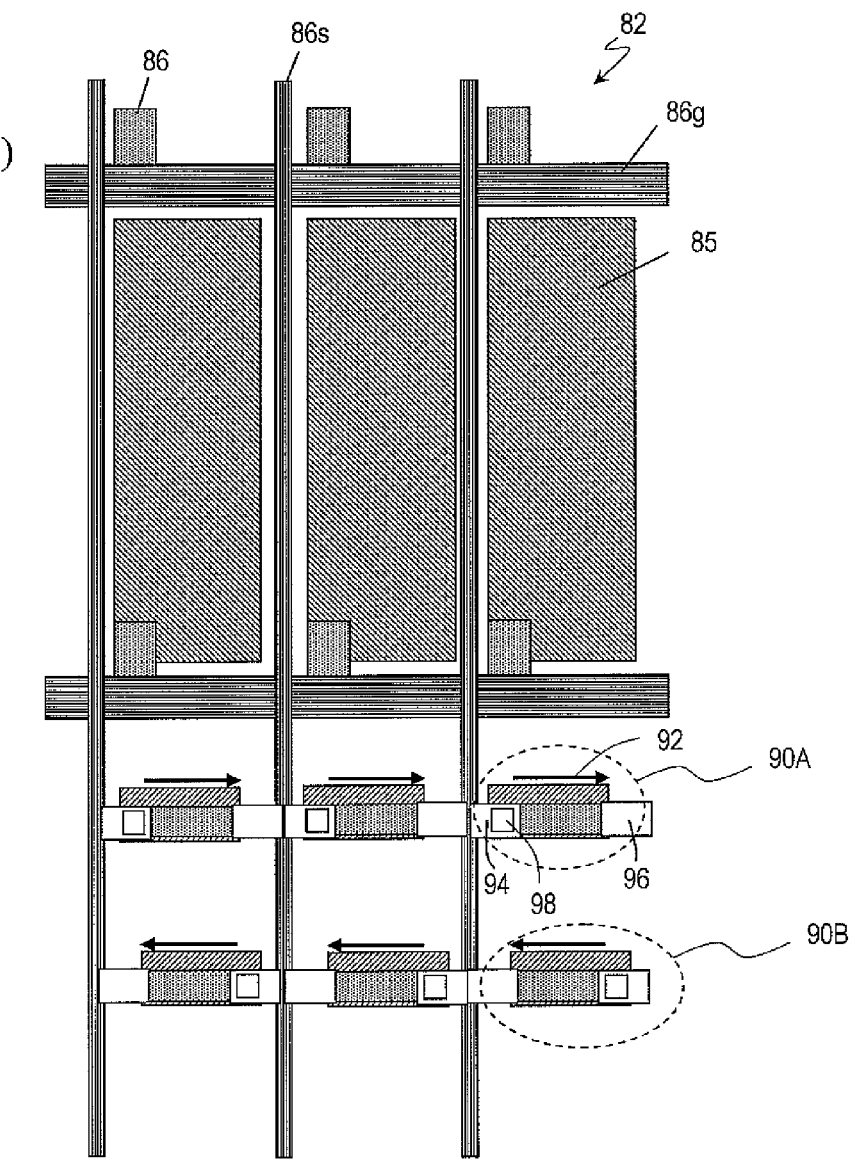

FIG.24
(a)
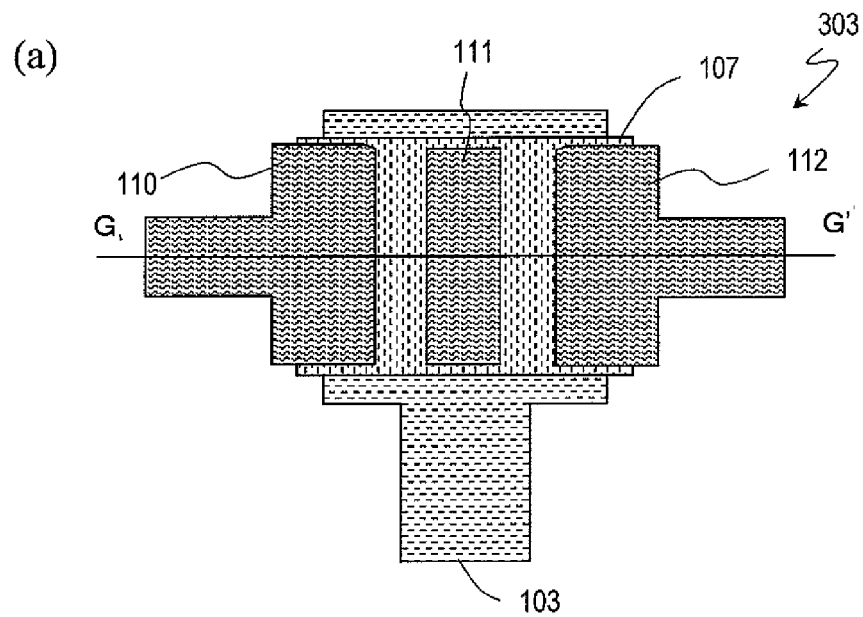
(b)
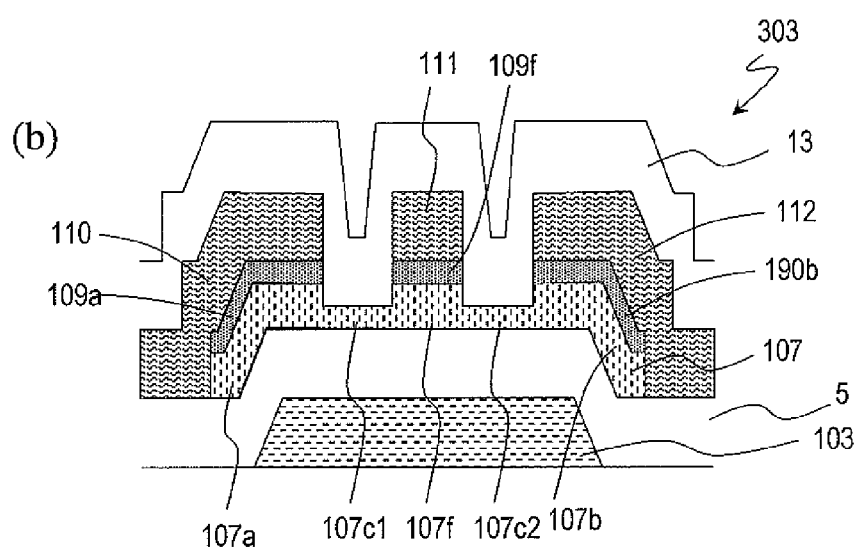
(c)
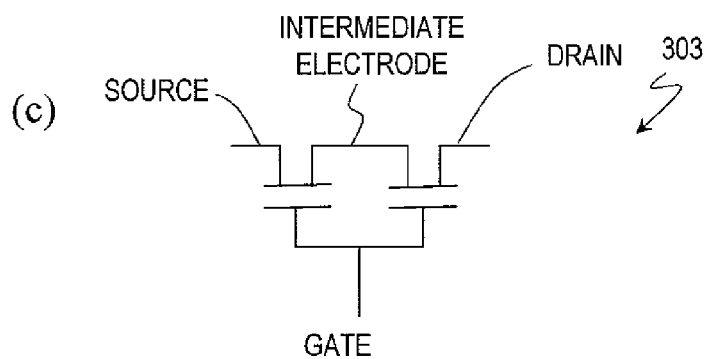

FIG.25
Prior Art
(a)
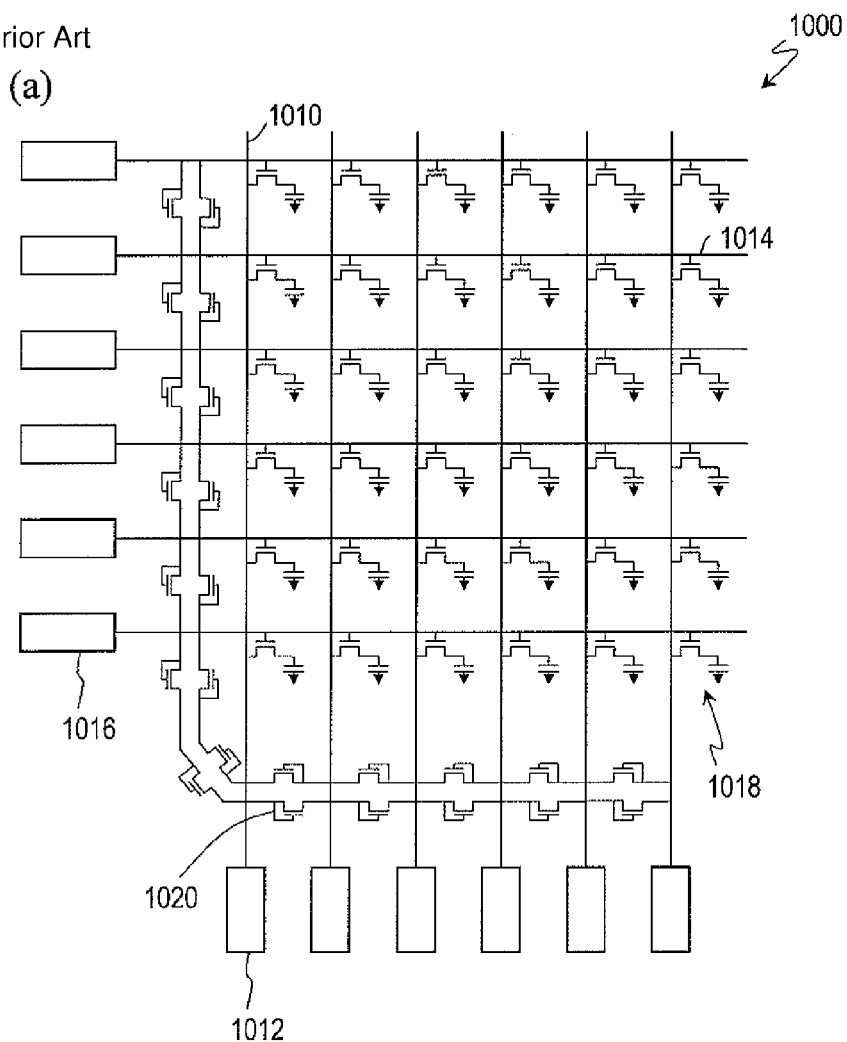
Prior Art
(b)
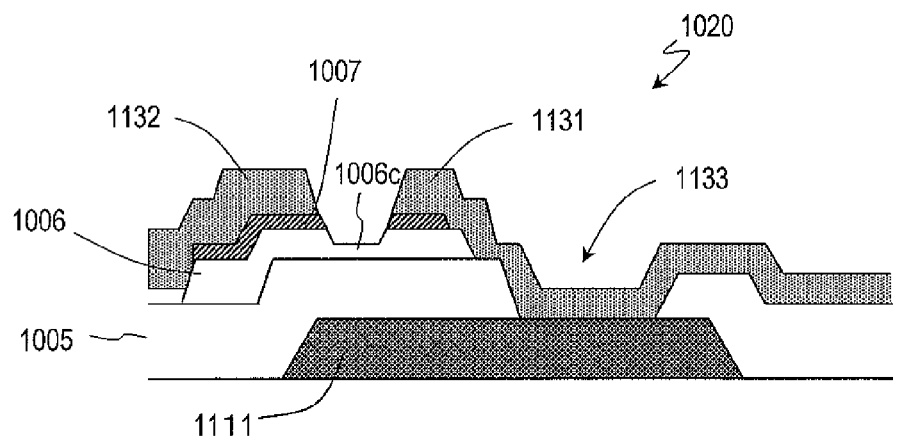

SEMICONDUCTOR DEVICE

TECHNICAL FIELD

The present invention relates to a semiconductor device which includes a thin film transistor and a diode on the same substrate.

BACKGROUND ART

An active matrix substrate for use in a liquid crystal display device, or the like, includes a switching element, such as a thin film transistor (hereinafter, "TFT"), in each pixel. Examples of such a switching element which have been conventionally used in various applications include a TFT which includes an amorphous silicon film as an active layer (hereinafter, "amorphous silicon TFT") and a TFT which includes a polycrystalline silicon film as an active layer (hereinafter, "polycrystalline silicon TFT").

Since the mobility of electrons and holes in the polycrystalline silicon film is higher than in the amorphous silicon film, the polycrystalline silicon TFT has a higher ON current, and is capable of operating at a higher speed, than the amorphous silicon TFT. Thus, when an active matrix substrate is fabricated using the polycrystalline silicon TFT, the polycrystalline silicon TFT can also be used for a peripheral circuit, such as a driver and the like, as well as the switching elements. Therefore, there is an advantage that part or entirety of the peripheral circuit, such as a driver and the like, and a display portion can be integrally formed on the same substrate. Also, there is another advantage that the pixel capacitor of a liquid crystal display device, or the like, can be charged within a shorter switching time.

However, fabrication of the polycrystalline silicon TFT requires complicated steps, including a laser crystallization step for crystallization of the amorphous silicon film as well as a heat anneal step, an ion doping step, etc. These steps disadvantageously increase the fabrication cost per unit area of the substrate. Therefore, the polycrystalline silicon TFT has been mainly used in middle-size and small-size liquid crystal display devices.

On the other hand, the amorphous silicon film can be formed more easily than the polycrystalline silicon film and is therefore suitable to larger display sizes. Thus, the amorphous silicon TFT is suitably used in an active matrix substrate of a device of which a large area is demanded. In many active matrix substrates for liquid crystal television displays, the amorphous silicon TFT is used, notwithstanding it has a lower ON current than the polycrystalline silicon TFT.

However, when the amorphous silicon TFT is used, improvement in performance is limited because the mobility is low in the amorphous silicon film. Particularly, in recent years, improvement in display quality and reduction in power consumption as well as increase in display size have been highly demanded of liquid crystal display devices, such as liquid crystal television displays. The amorphous silicon TFT has a difficulty in sufficiently meeting such a demand.

To realize a TFT of higher performance with a reduced number of fabrication steps and a reduced fabrication cost, uses of other materials than amorphous silicon and polycrystalline silicon for the material of the active layer have been attempted. Patent Document 1, Patent Document 2, and Non-patent Document 1 propose that a microcrystalline silicon (μc-Si) film is used to form an active layer of a TFT. Such a TFT is called "microcrystalline silicon TFT".

The microcrystalline silicon film is a silicon film which contains microcrystalline grains in its inside. The grain boundary of the microcrystalline grains is mainly composed of an amorphous phase. Specifically, the grain boundary is in a state where the crystalline phase formed of microcrystalline grains and the amorphous phase are mixed. The size of each microcrystalline grain is smaller than the size of the crystal grains contained in the polycrystalline silicon film. Also, as will be described in detail later, in the microcrystalline silicon film, each microcrystalline grain has the shape of, for example, a column grown from the substrate surface.

The microcrystalline silicon film can be formed only by a film formation step with the use of a plasma CVD method. As the material gas, a silane gas diluted with a hydrogen gas can be used. In the case of forming a polycrystalline silicon film, after formation of an amorphous silicon film with the use of a CVD apparatus or the like, the step of crystallizing the amorphous silicon film by laser or heat (annealing step) is necessary. On the other hand, in the case of forming a microcrystalline silicon film, a microcrystalline silicon film which includes a basic crystalline phase can be formed by a CVD apparatus or the like, and thus, the annealing step with laser or heat can be omitted. Since the microcrystalline silicon film thus can be formed by a smaller number of steps than that required for the formation of the polycrystalline silicon film, the microcrystalline silicon TFT can be fabricated with substantially the same degree of productivity as that of the amorphous silicon TFT, i.e., with substantially the same number of steps and substantially the same fabrication cost. Also, a microcrystalline silicon TFT can be fabricated using an apparatus designed for fabrication of the amorphous silicon TFT.

Since the microcrystalline silicon film has a higher mobility than the amorphous silicon film, using the microcrystalline silicon film can realize a higher ON current than the amorphous silicon TFT. Since the microcrystalline silicon film can be formed without complicated steps as required in the formation of the polycrystalline silicon film, larger areas can easily be realized.

Patent Document 1 describes using a microcrystalline silicon film as the active layer of a TFT, whereby the ON current achieved is 1.5 times that achieved in an amorphous silicon TFT. Non-patent Document 1 describes using a semiconductor film composed of microcrystalline silicon and amorphous silicon, whereby a TFT is obtained in which the ON/OFF current ratio is $10^6$, the mobility is about 1 $cm^2/Vs$, and the threshold is about 5 V. This value of the mobility is greater than that of the amorphous silicon TFT. Note that the TFT described in Non-patent Document 1 includes an amorphous silicon layer which is provided on a microcrystalline silicon layer in order to reduce the OFF current. Patent Document 2 discloses an inverted staggered (bottom gate structure) TFT in which microcrystalline silicon is used.

TFTs in which a metal oxide semiconductor is used as a new material that can replace silicon, such as Zn—O based semiconductor (ZnO) films and In—Ga—Zn—O based semiconductor (IGZO) films, have been proposed. Patent Document 3 describes using a semiconductor layer made of ZnO, which leads to a TFT that is characterized in that the ON/OFF current ratio is $4.5\times10^5$, the mobility is about 150 $cm^2/Vs$, and the threshold is about 1.3 V. This mobility value is much higher than the mobility of an amorphous silicon TFT. Patent Document 2 describes using a semiconductor layer made of IGZO, which leads to a TFT that is characterized in that the mobility is about 5.6 to 8.0 $cm^2/Vs$ and the threshold is about −6.6 to −9.9 V. Also, this mobility is much higher than the mobility of an amorphous silicon TFT.

On the other hand, an active matrix substrate usually includes a short ring between wires, such as source and gate bus lines, in order to prevent electrostatic damage to elements, wires, etc. In conventional devices, as a short ring, a conductive line is formed around the gate bus lines and the source bus lines such that these lines are all electrically coupled together. However, such a short ring need to be removed before a driver for driving, and the like, is mounted on the substrate, and therefore, an element cannot be sufficiently protected from static electricity which would occur in a mounting step.

As a solution to this problem, forming a short ring with the use of a semiconductor film which is the same as the semiconductor layer of the TFT has been proposed. For example, Patent Documents 4 to 6 disclose forming two-terminal elements (hereinafter, also referred to as "short ring diodes") with the use of a semiconductor film to form a short ring between source bus lines and/or between gate bus lines. In Patent Document 4, an amorphous silicon film is used as the semiconductor film. In Patent Documents 5 and 6, a polysilicon film (polycrystalline silicon film) is used as the semiconductor film.

FIG. 25(a) is a plan view of an active matrix substrate disclosed in Patent Document 4. The active matrix substrate 1000 includes a plurality of gate bus lines 1014 which are arranged in parallel with one another, a plurality of source bus lines 1010 which are perpendicular to the gate bus lines 1014, pixel electrodes (not shown) which are respectively provided in rectangular regions enclosed by the gate bus lines 1014 and the source bus lines 1010, and thin film transistors 1018 provided in the vicinity of the intersections of the gate bus lines 1014 and the source bus lines 1010. The thin film transistors 1018 function as switching elements for the respective pixels. The gate bus lines 1014 are connected to gate terminals 1016. The source bus lines 1010 are connected to source terminals 1012. Short ring diodes 1020 which are formed with the use of a semiconductor film that is the same as the semiconductor layer of the thin film transistors 1018 are provided between adjacent ones of the gate bus lines 1014 and between adjacent ones of the source bus lines 1010. The diodes 1020 have a configuration in which the source and the gate of the TFT are short-circuited and are also referred to as "TFT-type diodes".

In the active matrix substrate 1000, when external static electricity comes in any of the terminals 1012, 1016, the gate of the diode 1020 which is connected to that gate 1012, 1016 opens so that the charges sequentially diffuse to the adjacent lines 1010, 1014. As a result, all of the source bus lines 1010 and the gate bus lines 1014 become equipotential so that the thin film transistors 1018 can be prevented from being damaged by static electricity.

FIG. 25(b) is a schematic cross-sectional view of a TFT-type diode 1020 disclosed in Patent Document 4. The diode 1020 includes a gate electrode 1111, a semiconductor layer 1006 provided on the gate electrode 1111 with the intervention of a gate insulating film 1005 therebetween, and a first electrode (source electrode) 1131 and a second electrode (drain electrode) 1132 which are electrically connected to respective ones of the opposite sides of the semiconductor layer 1006. A contact layer 1007 is provided between the semiconductor layer 1006 and the first and second electrodes 1131, 1132. The first electrode 1131 is connected to the gate electrode 1111 in a contact hole 1133. Part of the semiconductor layer 1006 lying between the two electrodes 1131, 1132, i.e., portion 1006c, extends above the gate electrode 1111.

In the diode 1020 having such a structure, when a positive potential, relative to the potential of the second electrode 1132 which serves as a reference (0 V), is supplied to the first electrode 1131, the gate electrode 1111 also has a positive potential. Accordingly, part of the semiconductor layer 1006 extending above the gate electrode 1111, i.e., portion 1006c, has a decreased electric resistance, so that a channel is formed. As a result, an electric current flows between the first electrode 1131 and the second electrode 1132.

CITATION LIST

Patent Literature

Patent Document 1: Japanese Laid-Open Patent Publication No. 6-196701
Patent Document 2: Japanese Laid-Open Patent Publication No. 5-304171
Patent Document 3: Japanese Laid-Open Patent Publication No. 2002-76356
Patent Document 4: Japanese Laid-Open Patent Publication No. 10-20336
Patent Document 5: Japanese Laid-Open Patent Publication No. 2007-212711
Patent Document 6: Japanese Laid-Open Patent Publication No. 11-231345

Non-Patent Literature

Non-patent Document 1: Zhongyang Xu et al., "A Novel Thin-film Transistors With μc-Si/a-Si Dual Active Layer Structure For AM-LCD" *IDW '96 Proceedings of The Third International Display Workshops VOLUME* 1, 1996, pp. 117-120.
Non-patent Document 2: Je-hun Lee et al., "World's Largest (15-inch) XGA AMLCD Panel Using IGZO Oxide TFT," *SID 08 DIGEST*, US, Society for Information Display, 2008, vol. 39, 1st edition, pp. 625-628.

SUMMARY OF INVENTION

Technical Problem

Fabrication of an active matrix substrate which has a short ring structure such as shown in FIGS. 25(a) and 25(b) with the use of a semiconductor film of high mobility, such as a microcrystalline silicon film, leads to a problem which will be described below.

When a semiconductor film of high mobility is used for formation of the semiconductor layer of the thin film transistors 1018 which function as switching elements and the semiconductor layer of the short ring diodes 1020, designing the diodes 1020 in the same manner as in formation with the use of an amorphous silicon film leads to a higher mobility of the semiconductor layer of the diodes 1020 than in the conventional device, so that an electric current can readily flow through the diodes 1020 (i.e., the short ring resistance decreases). When the electric current excessively flows through the diodes 1020, a leakage current occurs between the source bus lines 1010 or between the gate bus lines 1014 even in a normal operation, so that a normal signal may not be supplied.

A larger short ring resistance with the use of a semiconductor layer of high mobility can be realized by, for example, increasing the ON-resistance of the diodes 1020. Since the ON-resistance of the diode 1020 is proportional to the length of the channel region 1006c (hereinafter, referred to as "channel length" L) of the diode 1020 and is inversely proportional to the width of the channel region 1006c (hereinafter, referred to as "channel width") W, a larger short ring resistance can be realized by increasing the channel length L or decreasing the channel width W. However, there is a restriction on the process (a limitation on the minimum pattern size by the existing apparatus), and there is a probability that the channel width W cannot be sufficiently decreased. On the other hand, as the channel length L increases, the size of the diode 1020 also increases. Thus, it is greater than the design size of the active matrix substrate which includes amorphous silicon, leading to the demerit of increasing the size of the frame region (part of the active matrix substrate outside the display region).

In one example, a short ring diode which is fabricated with the use of existing amorphous silicon has the channel length L of about 20 to 30 μm and the channel width W of about 10 to 20 μm. According to the specifications of the existing apparatus, in a stepper exposure apparatus which uses g- and h-lines that are commonly employed, the lower limit of the channel width W is about 3 to 3.5 μm. If it is lower than that, the accuracy deteriorates. Here, if a semiconductor film used has a mobility which is equal to or greater than three times the mobility of the amorphous silicon, a sufficient short ring resistance cannot be secured only by decreasing the channel width W. Therefore, it is necessary to increase the channel length L. Thus, the size of the diode increases as described above, and as a result, the frame region of the display device increases.

A thin film transistor which is fabricated with the use of, particularly, a metal oxide semiconductor has a very high mobility. In an example of Patent Document 3 in which the Zn—O based semiconductor (ZnO) is used, the mobility of the thin film transistor is as high as about 150 $cm^2/Vs$. Therefore, when a conventional diode is fabricated, the frame region of the display device greatly increases. Likewise, in an example of Non-patent Document 2 in which an In—Ga—Zn—O based semiconductor (IGZO) film is used, the mobility of the thin film transistor is as high as 5.6 to 8.0 $cm^2/Vs$. Therefore, when a conventional diode is fabricated, the frame region of the display device greatly increases likewise. This also applies to a case where an In—Zn—O based semiconductor (IZO) film or a Zn—Ti—O based semiconductor (ZTO) film, which is a metal oxide semiconductor that is capable of high mobility, is used.

Here, although the description has been provided with an example of the short ring diodes, a TFT-type diode which is used in a different application, for example, in a circuit such as a driving circuit, for example, commonly has the above problems.

The present invention was conceived in view of the above problems. One of the objects of the present invention is to provide a substrate in which a thin film transistor and a diode are provided on the same substrate, and the magnitude of a current in the diode is controlled without increasing the size of the diode.

Solution to Problem

A semiconductor device of the present invention includes a substrate, and a thin film transistor and a diode which are provided on the substrate, wherein the diode includes a gate electrode provided on the substrate, a gate insulating layer provided on the gate electrode, at least one semiconductor layer provided on the gate insulating layer, the at least one semiconductor layer including a first region and a second region, a first electrode provided on the first region, the first electrode being electrically coupled to the first region and the gate electrode, and a second electrode provided on the second region, the second electrode being electrically coupled to the second region, the at least one semiconductor layer includes a channel region which extends above the gate electrode with the intervention of the gate insulating layer therebetween, and a resistor region which does not extend above the gate electrode with the intervention of the gate insulating layer therebetween, and when the diode is in an ON state, an electric current path is formed between the first electrode and the second electrode, the electric current path including the channel region and the resistor region.

In a preferred embodiment, the diode further includes a conductive layer which is provided between the substrate and the gate insulating layer and which is separated from the gate electrode, and the resistor region is arranged so as to extend above the conductive layer with the intervention of the gate insulating layer therebetween.

In a preferred embodiment, the at least one semiconductor layer is a plurality of semiconductor layers including a first semiconductor layer which includes the first region and a second semiconductor layer which includes the second region, the diode further includes at least one intermediate electrode which couples the plurality of semiconductor layers in series, and the plurality of semiconductor layers includes a semiconductor layer which does not extend above the gate electrode.

In a preferred embodiment, the at least one semiconductor layer includes one semiconductor layer which includes the first and second regions, the channel region, and the resistor region.

In a preferred embodiment, the diode further includes another gate electrode provided at a position which is closer to the second electrode than the gate electrode is, the one semiconductor layer further includes another channel region provided at a position which is closer to the second electrode than the channel region is, the another channel region extends above the another gate electrode with the intervention of the gate insulating layer therebetween, and the resistor region is provided between the channel region and the another channel region.

In a preferred embodiment, the one semiconductor layer further includes an intermediate region between the channel region and the resistor region, and the diode is provided on the intermediate region and further includes an intermediate electrode which is electrically coupled to the intermediate region.

The at least one semiconductor layer and the semiconductor layer of the thin film transistor may be formed of the same semiconductor film.

The at least one semiconductor layer and the semiconductor layer of the thin film transistor may be formed of a microcrystalline silicon film which includes a crystalline phase and an amorphous phase.

The volume fraction of the amorphous phase in the microcrystalline silicon film may be not less than 5% and not more than 95%.

The volume fraction of the amorphous phase in the microcrystalline silicon film may be not less than 5% and not more than 40%.

The at least one semiconductor layer may contain a metal oxide semiconductor.

In a preferred embodiment, the semiconductor device further includes a plurality of bus lines, the bus lines including a gate bus line and a source bus line which are in a lattice arrangement on the substrate, wherein the first electrode of the diode is electrically coupled to any one of the plurality of bus lines, the second electrode of the diode is electrically coupled to another one of the plurality of bus lines.

In a preferred embodiment, the semiconductor device further includes a display region which is provided on the substrate and which includes a plurality of pixels, and a driver circuit which is provided on part of the substrate other than the display region, wherein the driving circuit includes the thin film transistor and the diode.

Advantageous Effects of Invention

According to the present invention, in a semiconductor device which includes thin film transistors and diodes on the same substrate, the resistance of the diodes can be increased without increasing the size of the diodes, so that the electric current flowing between the terminals of the diodes can be decreased.

A diode of the present invention is particularly preferably used in a short ring. When a short ring is formed with the use of diodes of the present invention the thin film transistors are protected from static electricity, and occurrence of a leakage current between the terminals of the diodes can be prevented.

Applying the present invention to an active matrix substrate in which a semiconductor film of high mobility, such as a microcrystalline silicon film or a zinc oxide film, is used, is particularly effective.

BRIEF DESCRIPTION OF DRAWINGS

FIGS. 1(a) and (b) schematically shows a semiconductor device of embodiment 1 of the present invention. (a) is a plan view of the semiconductor device. (b) is a cross-sectional view taken along line A-A' and line B-B' of (a).

FIGS. 5(a) and (b) are diagrams for illustrating a fabrication step of the semiconductor device of embodiment 1 of the present invention. (a) is a plan view. (b) is a cross-sectional view taken along line A-A' and line B-B' of (a).

FIG. 7(a) is a plan view of another semiconductor device of embodiment 1 of the present invention. (b) is a cross-sectional view taken along line A-A' and line B-B' of (a).

FIG. 10(a) is a plan view for illustrating channel length L, resistor region length $L_R$, and channel width W of the sample elements E1 to E3 of the embodiment examples. (b) is a plan view for illustrating channel width W and channel length L of the sample elements C1 to C6 of the comparative examples.

FIG. 11(a) is a graph illustrating the diode characteristic of the sample elements of the embodiment examples and the comparative examples. (b) and (c) show the structures of the sample elements of the comparative examples and the embodiment examples.

FIG. 13(a) is a plan view schematically showing a diode of embodiment 3 of the present invention. (b) is a cross-sectional view taken along line F-F' of (a).

FIG. 16(a) is a schematic cross-sectional view of a liquid crystal display device in which the active matrix substrate of embodiment 5 of the present invention is used. (b) is a top view schematically showing the active matrix substrate of (a).

FIGS. 24(a) to (c) show other structures of a thin film transistor of the present invention.

FIG. 25(a) is a plan view of a conventional active matrix substrate. (b) is a cross-sectional view of the diode shown in (a).

DESCRIPTION OF EMBODIMENTS

The present invention is characterized in that, in a TFT-type diode, an electric current path of at least one semiconductor layer includes a channel region that extends above a gate electrode and a portion which does not extend above the gate electrode.

According to the present invention, a portion of the semiconductor layer in the electric current path which does not extend above the gate electrode serves as a resistor, so that an electric current does not smoothly flows between the terminals of the diode. Thus, by modifying the size of such a resistor (hereinafter, "resistor region"), the magnitude of the electric current flowing between the terminals of the diode can be controlled to have a desired value, without increasing the size of the diode.

In the present specification, the "electric current path" of a diode refers to a region through which an ON-current flows when the diode is in an ON state. The electric current path includes, in the semiconductor layer, a first region which is electrically coupled to a first electrode (source electrode), a channel region, and a second region which is electrically coupled to a second electrode (drain electrode). However, the electric current path does not include part of the semiconductor layer which is electrically coupled to, for example, an intermediate electrode.

The present invention is preferably applicable to, for example, an active matrix substrate. When applied to an active matrix substrate, the above-described diode may be used to form a short ring. Thus, when static electricity comes in a wire on the active matrix substrate, an electric current of an appropriate magnitude is allowed to flow between the terminals of the diodes, whereby elements on the substrate can be protected.

Alternatively, the above-described diode may be used to form a driving circuit. In this case, the resistance of the diode can be optimized without excessively increasing the size of the diode.

In a preferred embodiment of the present invention, a semiconductor film which has a higher mobility than amorphous silicon is used to form a semiconductor layer of TFTs and diodes. Examples of such a semiconductor film include microcrystalline silicon films and metal oxide semiconductor films.

As described above, in the conventional element, when a semiconductor film of high mobility is used, the ON characteristic of the TFT can be improve while the resistance of the diode decreases, so that an electric current readily flows through the diode.

Figure 26:
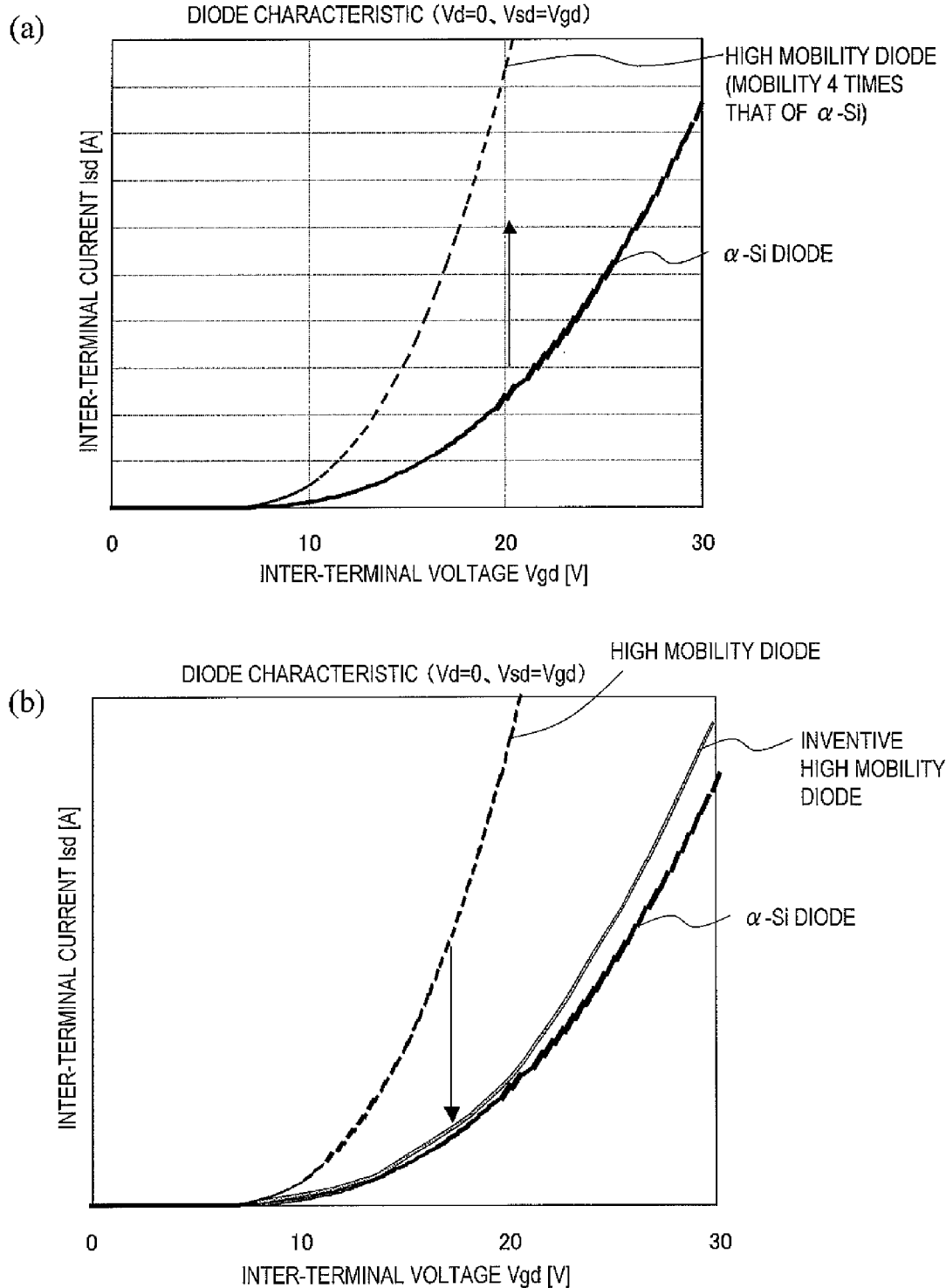
FIGS. 26(a) and (b) are examples of the graphs for comparison of the characteristics of an a-Si diode and the characteristics of a diode in which a semiconductor film of higher mobility that that of a-Si is used.

FIG. 26(a) is an example of the graph for comparison of the characteristics between a diode in which an amorphous silicon film is used (a-Si diode) and a diode in which a semiconductor film that has a higher mobility than amorphous silicon is used (high mobility diode). The abscissa axis represents the voltage which is to be applied between the terminals of the diode, and the ordinate axis represents the electric current flowing between the terminals, both axes being on linear scales. In the example illustrated herein, both the saturated region mobility and the linear region mobility in the high mobility diode are four times those of the amorphous silicon, and the other characteristics than mobility (e.g., the threshold of the TFT which forms the diode) are equal to those of the amorphous silicon.

As seen from FIG. 26(a), when the voltages which are to be applied between the terminals are equal, the electric current flowing through the high mobility diode is much larger than the electric current flowing through the a-Si diode. Thus, in some applications of the diode, it is necessary to increase the channel length L in order to decrease the current capacity of the diode.

On the other hand, according to the present embodiment, part of the electric current path in the semiconductor layer does not extend over the gate electrode. Therefore, even when a positive potential is supplied to the first electrode, part of the semiconductor layer which does not extend above the gate electrode is not supplied with the positive potential via the gate electrode. Thus, electrons, which are movable charges, are not accumulated so that the electric resistance in this part does not decrease. Therefore, the part which does not extend above the gate electrode constitutes an electric resistor which is coupled in series to the channel region.

Thus, by modifying the size (area) of part of the semiconductor layer which does not extend above the gate electrode, a serial electric resistance of an appropriate size can be provided to the diode. Therefore, even when a high mobility semiconductor film, such as a crystalline silicon film, is used, characteristics which are approximately equal to those of the conventional short ring diode in which amorphous silicon is used can be realized as shown in FIG. 26(b).

Part of the semiconductor layer of the diode which does not extend above the gate electrode may be provided on a conductive layer which is not coupled to the first electrode of the diode. Here, the "conductive layer" may be formed of, for example, a conductive film that is the same as the gate electrode and may be a layer which is in an open state (floating state). Particularly, when the present invention is applied to a display device, it is preferred that a conductive layer is provided below part of the semiconductor layer which does not extend above the gate electrode, because the change of the characteristics of the semiconductor layer due to light from a backlight (light deterioration) can be prevented the conductive layer.

The semiconductor layer of a thin film transistor and a diode of a semiconductor device according to the present invention is preferably formed of a microcrystalline silicon film. When a polycrystalline silicon film is used, the resistance of the diode can be adjusted, e.g., increased, by modifying the concentration of the impurity which is used for doping of part of the semiconductor layer of the diode. On the other hand, performing the doping on a microcrystalline silicon film, which requires a heat treatment at a high temperature, greatly decreases the productivity which is generally equivalent to that of the amorphous silicon TFT, i.e., the merit of fabricating the element through a generally equal number of steps and with a generally equal fabrication cost, and such a measure is unsuitable to this situation. When an amorphous silicon film is used, in many cases, the resistance of the diode is sufficiently high, and it is not necessary to greatly decrease the electric current of the diode.

The microcrystalline silicon film has a mixed state of a crystalline phase which is formed of microcrystalline grains and an amorphous phase.

The volume fraction of the amorphous phase in the microcrystalline silicon film can be controlled within the range of not less than 5% and not more than 95%, for example. The volume fraction of the amorphous phase is preferably not less than 5% and not more than 40%. In this range, a microcrystalline silicon film having decreased defects in the film can be obtained, so that the ON/OFF ratio of the TFT can effectively be improved. When Raman scattering spectrometry with visible light is performed on the microcrystalline silicon film, the resultant spectrum has the highest peak at the wavelength of $520 \text{ cm}^{-1}$, which is the peak of the crystalline silicon, and has a broad peak at the wavelength of $480 \text{ cm}^{-1}$, which is the peak of the amorphous silicon. The height of the peak of the amorphous silicon near $480 \text{ cm}^{-1}$ is, for example, not less than $\frac{1}{30}$ and not more than 1 of the height of the peak of the crystalline silicon near $520 \text{ cm}^{-1}$.

For comparison purposes, Raman scattering spectrometry is performed on a polycrystalline silicon film, and an amorphous component is scarcely detected, the height of the peak of the amorphous silicon being substantially zero.

When forming a polycrystalline silicon film, the amorphous phase can be locally left under some crystallization conditions. Even in such a case, the volume fraction of the amorphous phase in the polycrystalline silicon film is less than about 5%, so that the height of the peak of the amorphous silicon in the Raman scattering spectrometry is less than about $\frac{1}{30}$ of the height of the peak of the polycrystalline silicon.

Such a microcrystalline silicon film can be formed by high density plasma CVD of, for example, CCP (capacitively-coupled plasma) type or ICP (inductively-coupled plasma) type. The above-described peak intensity ratio can be adjusted by modifying the mode of the apparatus and the film formation conditions of the plasma CVD.

Hereinafter, the structure of a microcrystalline silicon film which is preferably used in an embodiment of the present invention is described with reference to the drawings by means of comparison with the structures of a polycrystalline silicon film and an amorphous silicon film.

Figure 27:
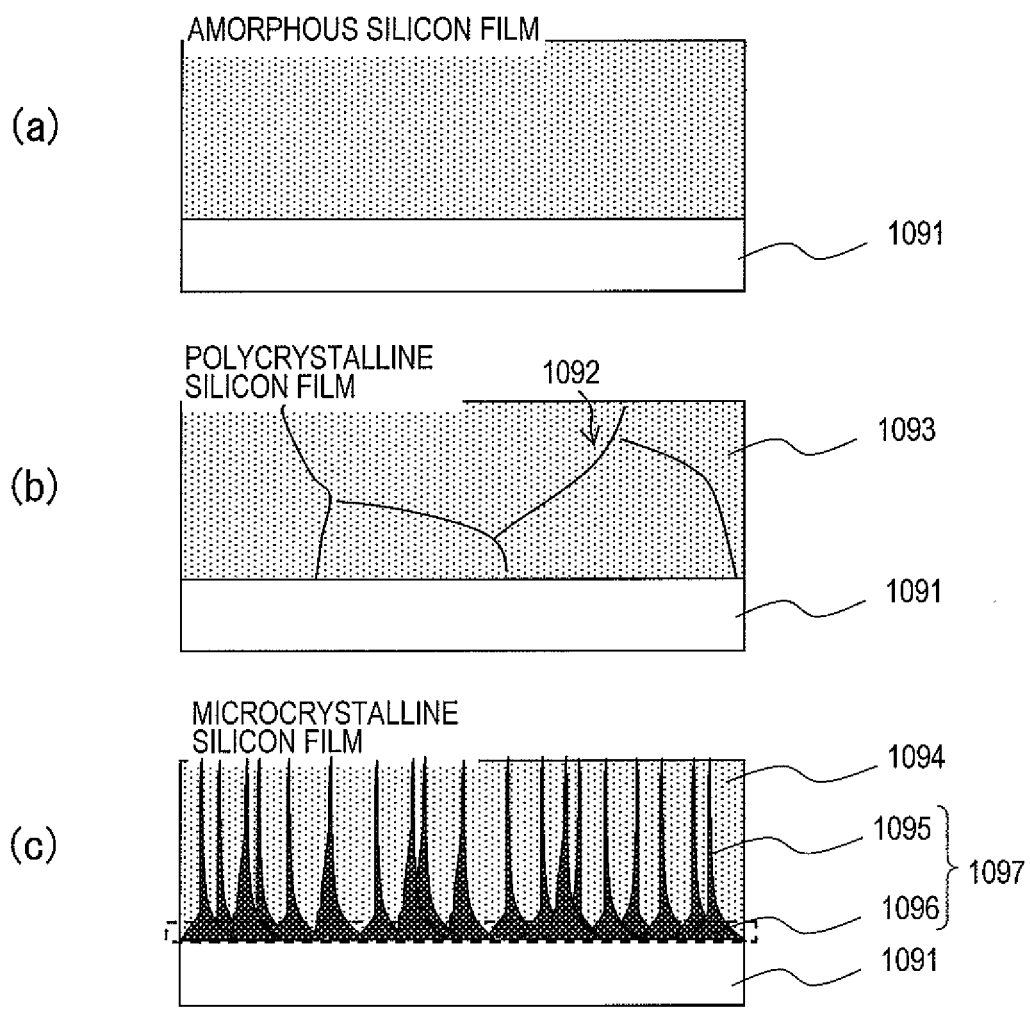
FIGS. 27(a) to (c) are enlarged schematic cross-sectional views showing examples of an amorphous silicon film, a polycrystalline silicon film, and a microcrystalline silicon film, respectively.

FIGS. 27(a) to 27(c) are schematic cross-sectional views showing examples of an amorphous silicon film, a polycrystalline silicon film, and a microcrystalline silicon film, respectively.

The amorphous silicon film is composed of an amorphous phase as shown in FIG. 27(a). The amorphous silicon film of this type is generally formed by, for example, plasma CVD on a substrate 1091.

The polycrystalline silicon film is composed of a plurality of crystal grains 1093 which are separated by grain boundaries 1092 as shown in FIG. 27(b). The polycrystalline silicon film is composed of crystalline silicon in almost all the part. The volume fraction of the grain boundaries 1092 in the polycrystalline silicon film is extremely small. The polycrystalline silicon film is obtained by, for example, performing a crystallization step with laser or heat on the amorphous silicon film formed on the substrate 1091.

The microcrystalline silicon film includes microcrystalline grains 1094 and grain boundaries 1095 composed of an amorphous phase as shown in FIG. 27(c). The substrate side of the microcrystalline silicon film is provided with a thin amorphous layer (hereinafter, "incubation layer") 1096. In this example, the grain boundaries 1095 and the incubation layer 1096 constitute an "amorphous phase" 1097 of the microcrystalline silicon film. The plurality of microcrystalline grains 1094 constitute a "crystalline phase".

In the example shown in FIG. 27(c), each of the microcrystalline grains 1094 has a columnar shape extending in the thickness direction of the microcrystalline silicon film, from the top of the incubation layer 1096 to the upper surface of the microcrystalline silicon film. Such a microcrystalline silicon film can be formed by substantially the same plasma CVD method as that employed in the fabrication method of the amorphous silicon film with the use of, for example, a silane gas diluted with a hydrogen gas as a source material gas.

The microcrystalline grains 1094 are smaller than the crystal grains 1093 of the polycrystalline silicon film (FIG. 27(b)). Observing a cross section of the microcrystalline silicon film with the use of a transmission electron microscope (TEM), the average grain size of the microcrystalline grains 1094 is not less than 2 nm and not more than 300 nm. Therefore, the crystalline cross section of the microcrystalline grains 1094 is sufficiently small as compared with the size of the semiconductor device, so that the characteristics of the semiconductor device can be made uniform.

The incubation layer 1096 grows more readily in the early part of the formation of the microcrystalline silicon film. The thickness of the incubation layer 1096 is, for example, several nanometers although it depends on the formation conditions of the microcrystalline silicon film. Note that, under some formation conditions or in some formation methods of the microcrystalline silicon film, e.g., particularly in the case of using high density plasma CVD, the incubation layer 1096 may scarcely be detected.

In the microcrystalline silicon film shown in FIG. 27(c), each of the microcrystalline grains 1094 has a columnar shape extending in a direction generally normal to the substrate 1091. However, the structure of the microcrystalline silicon film depends on the method and conditions of the formation of the microcrystalline silicon film and is not limited to the shown structure. Note that, however, the volume fraction of the amorphous phase in the microcrystalline silicon film and the peak intensity ratio (the ratio of the peak height of the amorphous silicon to the peak height of the crystalline silicon) are preferably within the ranges identified above irrespective of the structure of the microcrystalline silicon film. If so, a TFT with high ON characteristics can be realized.

The semiconductor device of the present embodiment preferably includes microcrystalline silicon TFTs which have a bottom gate structure. In this case, the TFT structure may be utilized to readily form short ring diodes such as described above. Since many of the conventional amorphous silicon TFTs have a bottom gate structure, the manufacturing equipment and facility for use in fabrication of the conventional amorphous silicon TFTs can be diverted to fabrication of the microcrystalline silicon TFT of this type, thus realizing a highly productive process.

Embodiment 1

Hereinafter, Embodiment 1 of a semiconductor device of the present invention is described with reference to the drawings.

FIG. 1 is a diagram schematically showing a semiconductor device of the present embodiment. FIG. 1(a) is a plan view of the semiconductor device. FIG. 1(b) is a cross-sectional view taken along line A-A' and line B-B' of FIG. 1(a).

A semiconductor device of the present embodiment includes a substrate 1, and a diode 201 and a thin film transistor 301 provided on the substrate 1. The diode 201 and the thin film transistor 301 are formed of the same semiconductor film. Here, a microcrystalline silicon film is used as the semiconductor film. The thin film transistor 301 is an inverted staggered channel etching type TFT which has a bottom gate structure. The diode 201 is, basically, an inverted staggered channel etching type TFT which has a bottom gate structure, in which however the gate electrode and the source electrode are coupled together.

The thin film transistor 301 includes a gate electrode 103 which is provided on the substrate 1, a gate insulating layer 5 which is provided so as to cover the gate electrode 103, a microcrystalline silicon layer 107 which is provided on the gate insulating layer 5, a source electrode 110 which is provided above the microcrystalline silicon layer 107 with the intervention of a contact layer 109a therebetween, and a drain electrode 112 which is provided above the microcrystalline silicon layer 107 with the intervention of a contact layer 109b therebetween.

The microcrystalline silicon layer 107 includes a channel region 107c, and a first region 107a and a second region 107b which are respectively provided on the opposite sides of the channel region 107c. The first region 107a is electrically coupled to the source electrode 110 via the contact layer 109a. The second region 107b is electrically coupled to the drain electrode 112 via the contact layer 109b. A gap portion 116 is provided on the channel region 107c.

The diode 201 includes a gate electrode 2, a conductive layer 3, and a connection wire 4, which are provided on the substrate 1, the gate insulating layer 5 which is provided so as to cover the gate electrode 2, the conductive layer 3, and the connection wire 4, a microcrystalline silicon layer 6 which is provided on the gate insulating layer 5 so as to extend above the gate electrode 2, a microcrystalline silicon layer 7 which is provided on the gate insulating layer 5 so as to extend above the conductive layer 3, a first electrode (source electrode) 10 which is provided above the microcrystalline silicon layer 6 with the intervention of a contact layer 8a therebetween, an intermediate electrode 11 which is provided above the microcrystalline silicon layers 6, 7 with the intervention of the contact layers 8b, 9a therebetween, and a second electrode (drain electrode) 12 which is provided above the microcrystalline silicon layer 7 with the intervention of a contact layer 9b therebetween.

The microcrystalline silicon layer 6 includes a channel region 6c, and a first region 6a and an intermediate region 6b which are respectively provided on the opposite sides of the channel region 6c. The first region 6a is electrically coupled to a source electrode 10 via the contact layer 8a. The intermediate region 6b is electrically coupled to the intermediate electrode 11 via the contact layer 8b. Likewise, the microcrystalline silicon layer 7 includes a region 7d which serves as a resistor (hereinafter, referred to as "resistor region"), and an intermediate region 7a and a second region 7b which are respectively provided on the opposite sides of the resistor region 7d. The intermediate region 7a is electrically coupled to the intermediate electrode 11 via the contact layer 9a. The second region 7b is electrically coupled to the drain electrode 12 via the contact layer 9b. Gap portions 15, 16 are provided above the channel region 6c and the resistor region 7d.

In the present embodiment, the gate electrode 2, the conductive layer 3, and the connection wire 4 are formed of the same conductive film. The gate electrode 2 is provided so as to extend under the channel region 6c of the microcrystalline silicon layer 6 and controls the conductivity of the channel region 6c. The gate electrode 2 is connected to the connection wire 4. The connection wire 4 is electrically coupled to the source electrode 10 in a contact hole 14 which is an opening formed in the gate insulating layer 5.

On the other hand, the conductive layer 3 is provided so as to extend under the microcrystalline silicon layer 7, i.e., at a position such that the conductivity of the resistor region 7d can be controlled. Note that the conductive layer 3 is not coupled to the other electrodes or wires, including the source electrode 10, and is therefore floating.

The microcrystalline silicon layers 107, 6, 7 in the thin film transistor 301 and the diode 201 include a plurality of columnar microcrystalline grains and grain boundaries composed of the amorphous phase as previously described with reference to FIG. 27(c). The volume fraction of the amorphous phase in the microcrystalline silicon layers 107, 6, 7 is, for example, 5% to 40%. The height of the peak of the amorphous phase which is detected by the Raman scattering spectrometry is 1/3 to 1/10 of the height of the peak of the microcrystalline part. Note that, instead of the microcrystalline silicon layers 107, 6, 7, an amorphous silicon layer or polycrystalline silicon layer may be used as the active layer. Alternatively, a film of a metal oxide semiconductor, such as a Zn—O based semiconductor (ZnO) film, an In—Ga—Zn—O based semiconductor (IGZO) film, an In—Zn—O based semiconductor (IZO) film, a Zn—Ti—O based semiconductor (ZTO) film, may be used as the active layer.

In the thin film transistor 301 and the diode 201, the contact layers 109a, 109b, 8a, 8b, 9a, 9b are provided for the purpose of improving the electric conduction between the microcrystalline silicon layers 107, 6, 7 and the corresponding electrodes 112, 110, 10, 11, 12. In the present embodiment, these contact layers are formed of the same $n^+$ type silicon film. Note that these contact layers may be a single layer, such as a polycrystalline silicon layer, a microcrystalline silicon layer, or an amorphous silicon layer, or may have a layered structure including at least one of these layers. Note that, in the case where a film of a metal oxide semiconductor is used as the active layer instead of the microcrystalline silicon layer, the contact layers may be omitted.

In the thin film transistor 301 and the diode 201, a passivation 13 may be provided over the electrodes 110, 112, 10, 11, 12 so as to cover the gap portions 116, 15, 16 and its surroundings. The passivation 13 may be a film of an inorganic material, such as silicon nitride, or an organic film, such as an acrylic resin, or may be a layered structured constituted of these films.

Although not shown, when necessary, an opening may be provided in the passivation 13 by means of photolithography, or the like, through which an electric signal, such as a predetermined voltage, is input to the source electrodes 110, 10 and the drain electrodes 112, 12. The source electrodes 110, 10 and the drain electrodes 112, may be appropriately coupled via the opening and connection wires such that an external electric signal can be input.

Here, the operation of the thin film transistor 301 and the diode 201 is described.

In the thin film transistor 301, when the resistance of the channel region 107c is sufficiently decreased according to a voltage applied to the gate electrode 103, an electric current flows mainly between the source electrode 110 and the drain electrode 112. The electric current flows from the source electrode 110 and passes through the contact layer 109a, and then flows through the first region 107a, the channel region 107c, and the second region 107b of the microcrystalline silicon layer 107. Thereafter, the electric current passes through the contact layer 109b and reaches the drain electrode 112.

In the diode 201, when the resistance of the channel region 6c is sufficiently decreased according to a voltage applied to the gate electrode 2, an electric current flows mainly between the source electrode 10 and the drain electrode 12. The electric current flows from the source electrode 10 and passes through the contact layer 8a, and then flows through the first region 6a, the channel region 6c, and the intermediate region 6b of the microcrystalline silicon layer 6. Thereafter, the electric current passes through the contact layer 8b and reaches the intermediate electrode 11. Likewise, an electric current flows from the intermediate electrode 11 and passes through the contact layer 9a, and then flows through the intermediate region 7a, the resistor region 7d, and the second region 7b of the microcrystalline silicon layer 7, in this order. Thereafter, the electric current flows through the contact layer 9b and reaches the drain electrode 12.

As previously described, the conductive layer 3 extending under the microcrystalline silicon layer 7 is not coupled to the other electrodes or wires, and therefore, a voltage is not directly applied to the conductive layer 3. Thus, the first region 7a, the resistor region 7d, and the second region 7b of the microcrystalline silicon layer 7 always exhibit high resistance values, and the diode 201 functions as a resistor rather than a switching element. In the diode 201, such a resistor exists between the source electrode 10 and the drain electrode 12, so that the resistance (ON resistance) between these electrodes can be increased. Therefore, even when microcrystalline silicon of high mobility is used to fabricate the diode 201, the electric current can be prevented from excessively flowing through the diode 201. Thus, the diode 201 can be suitably used for an application, such as a short ring diode, for example.

Note that, in FIG. 1, the microcrystalline silicon layer 7 on the drain electrode 12 side does not extend above the gate electrode 2. However, the above effects can be obtained even when this microcrystalline silicon layer 7 extends above the gate electrode 2 while, instead, the microcrystalline silicon layer 6 on the source electrode 10 side does not extend above the gate electrode 2. That is, the above effects can be obtained even in a structure where the gate electrode 2 and the conductive layer 3 are replaced with each other.

In the present embodiment and the other embodiments which will be described below, the semiconductor layer (active layer) of a thin film transistor and a diode is a single layer, for example, a single microcrystalline silicon layer. However, the semiconductor layer may have a layered structured constituted of, for example, a microcrystalline silicon layer and an amorphous silicon layer. Likewise, the gate electrode, the conductive layer, the source electrode, the intermediate electrode, and the drain electrode are not necessarily be formed by a single conductive layer, for example, a single metal layer, but may have a layered structure which is constituted of a plurality of layers of the same or different conductive materials.

An example of the substrate used for supporting the thin film transistor and the diode, other than the glass substrate, may be an insulating substrate, such as a plastic substrate. Alternatively, a stainless steel substrate which has an insulating film over the surface may be used. The substrate may not be a transparent substrate.

In the present embodiment and the other embodiments which will be described below, the thin film transistor and the diode may not necessarily have a passivation film.

<Fabrication Method of Semiconductor Device>

Next, an example of the fabrication method of the semiconductor device of the present embodiment is described with reference to the drawings.

Figure 2:
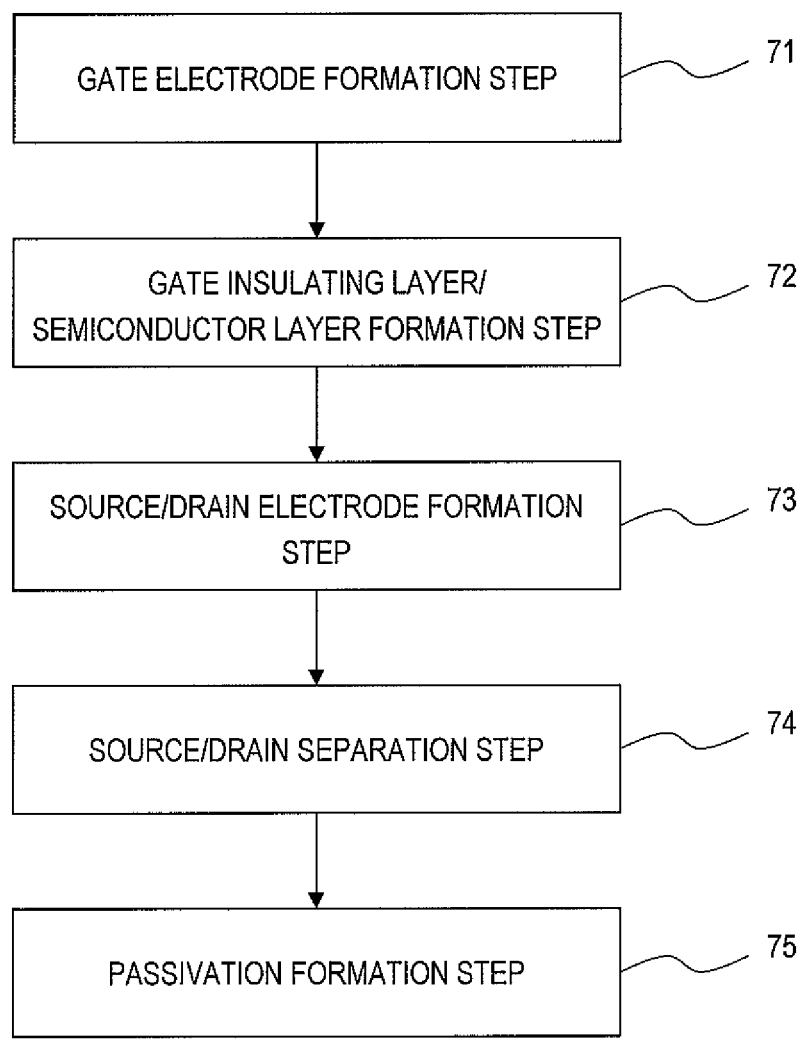
FIG. 2 A flowchart for illustrating an example of the fabrication method of the semiconductor device of embodiment 1 of the present invention.

FIG. 2 is a flowchart for illustrating a general procedure of the fabrication method of the present embodiment. As shown in FIG. 2, the fabrication method of the semiconductor device includes gate electrode formation step 71 for forming a gate electrode, gate insulating layer/semiconductor layer formation step 72 for forming a gate insulating layer and an island-like semiconductor layer which serves as an active layer, source/drain electrode formation step 73 for forming source and drain electrodes, and source/drain separation step 74 for electrically separating the source and drain electrodes, and passivation formation step 75.

Figure 3:
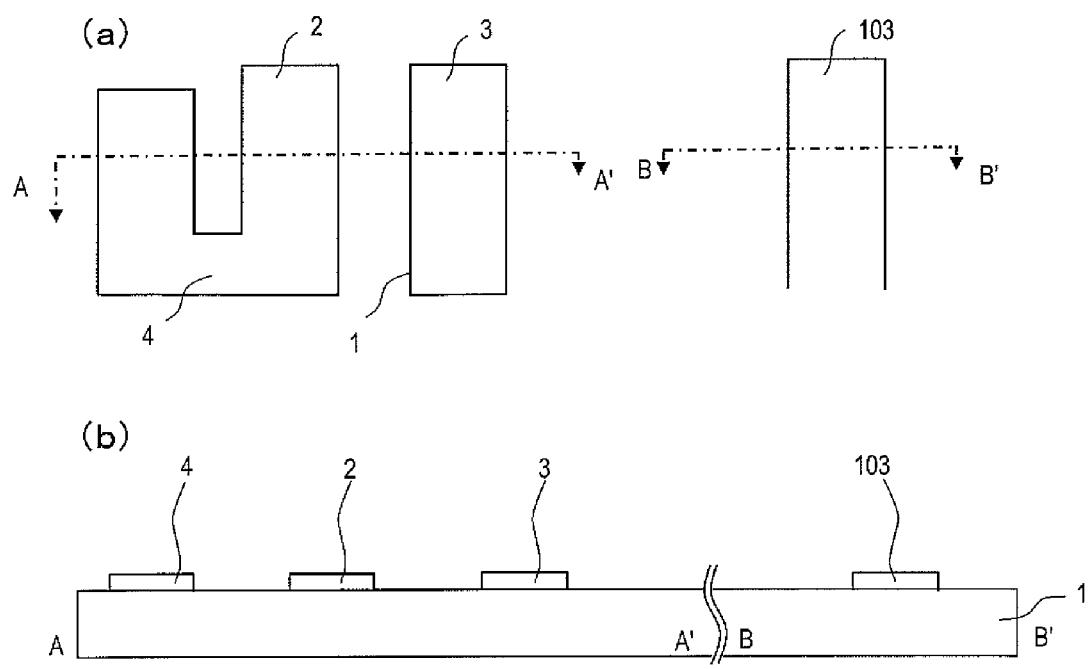
FIGS. 3(a) and (b) are diagrams for illustrating a fabrication step of the semiconductor device of embodiment 1 of the present invention. (a) is a plan view. (b) is a cross-sectional view taken along line A-A' and line B-B' of (a).
Figure 4:
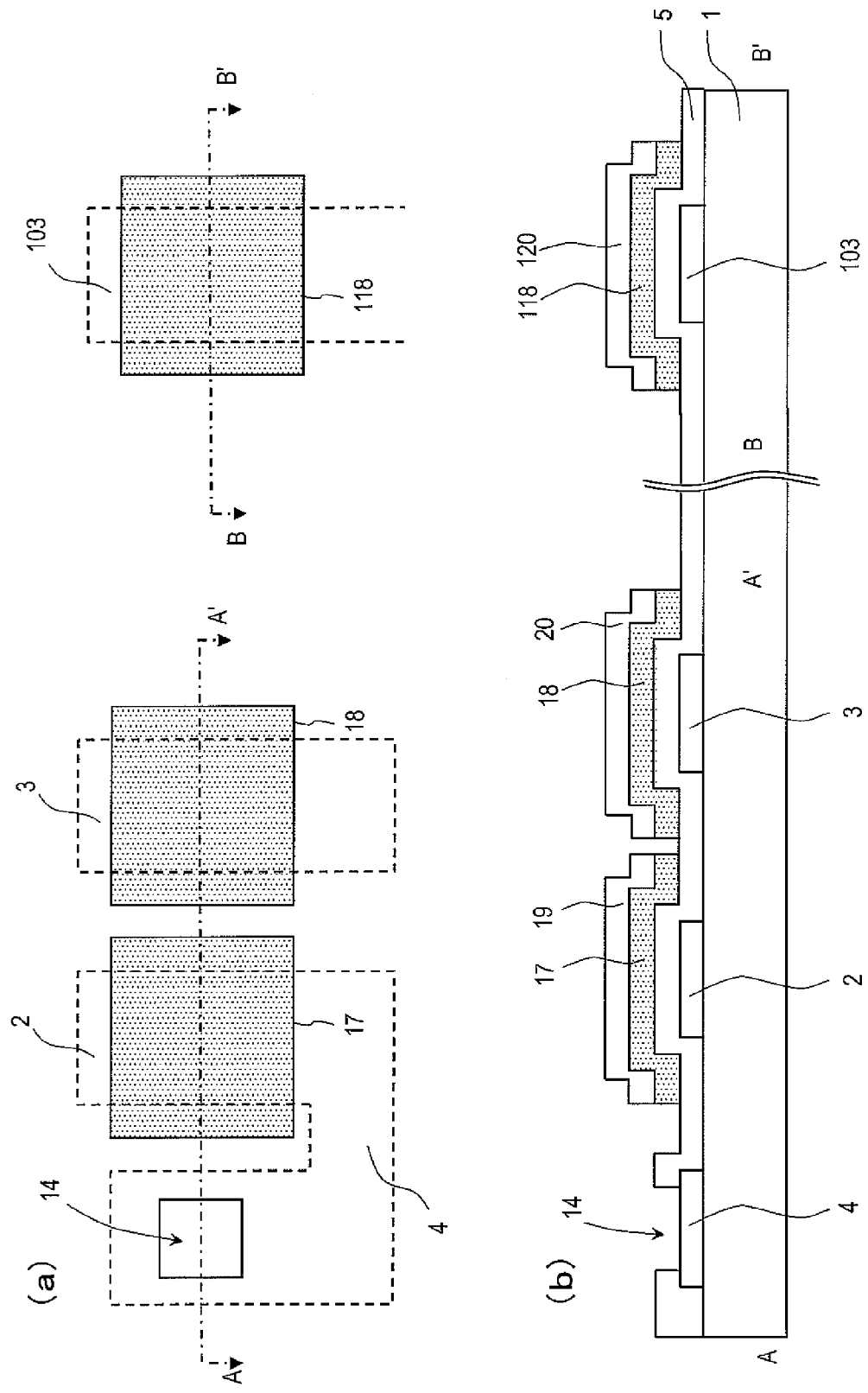
FIGS. 4(a) and (b) are diagrams for illustrating a fabrication step of the semiconductor device of embodiment 1 of the present invention. (a) is a plan view. (b) is a cross-sectional view taken along line A-A' and line B-B' of (a).
Figure 6:
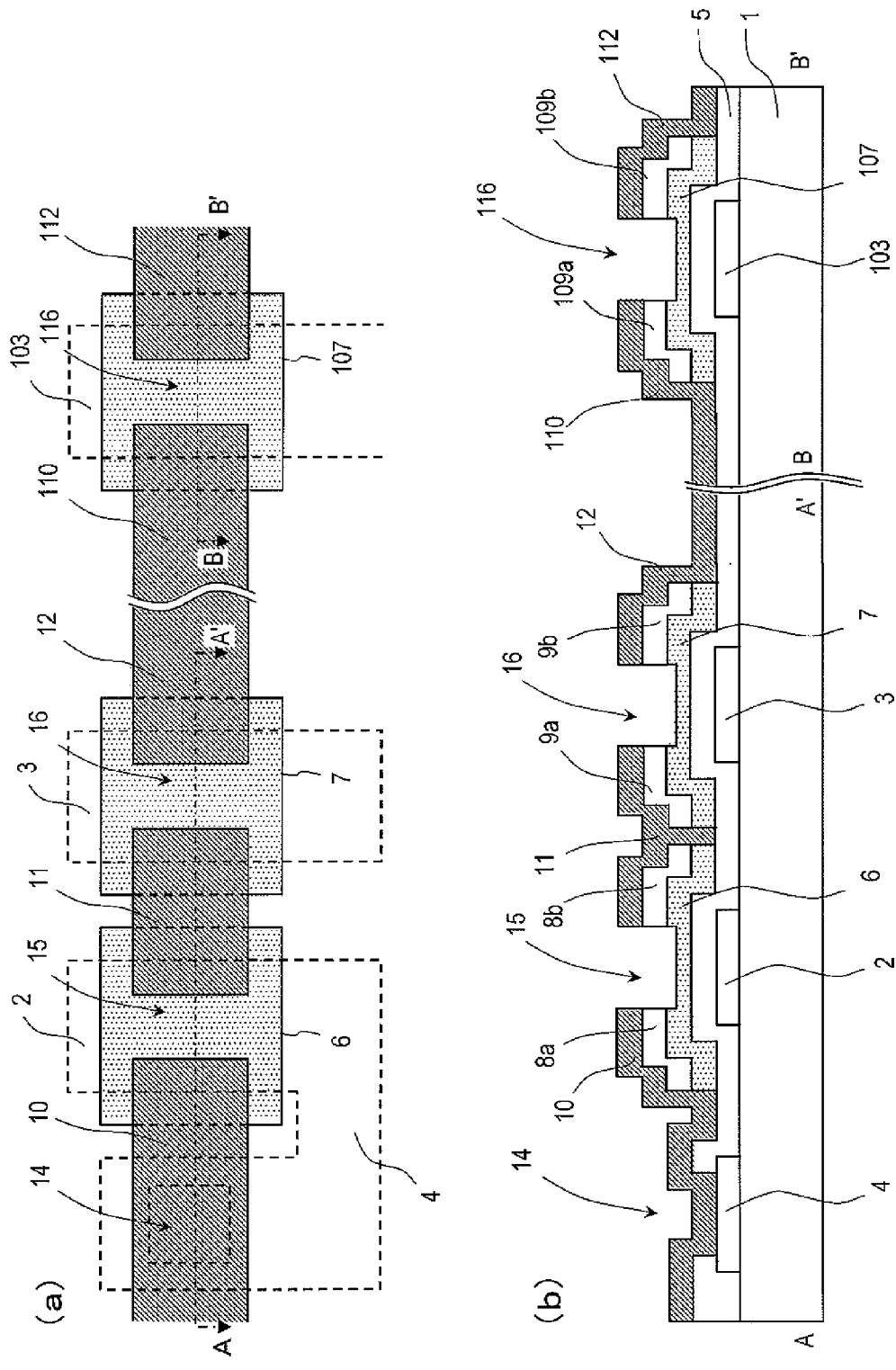
FIGS. 6(a) and (b) are diagrams for illustrating a fabrication step of the semiconductor device of embodiment 1 of the present invention. (a) is a plan view. (b) is a cross-sectional view taken along line A-A' and line B-B' of (a).

Hereinafter, the fabrication method is described in detail step by step with reference to FIG. 3 to FIG. 6. FIG. 3 to FIG. 6 are schematic diagrams for illustrating the respective steps of the fabrication method of the semiconductor device. FIG. 3(a) is a plan view. FIG. 3(b) is a cross-sectional view taken along line A-A' and line B-B' of FIG. 3(a). The same applies to FIG. 4 to FIG. 6. In each of these drawings, (a) is a plan view, and (b) is a cross-sectional view taken along line A-A' and line B-B' of the corresponding plan view.

(1) Gate Electrode Formation Step 71:

Referring to FIGS. 3(a) to 3(c), a gate metal film is formed on the substrate 1 and patterned to form the gate electrode 103 of the thin film transistor 301 and the gate electrode 2, the conductive layer 3, and the connection wire of the diode 201. The connection wire 4 and the gate electrode 2 are formed so as to be adjacent to each other such that they are included in one pattern segment. The conductive layer 3 is included in a pattern segment which is separate from the gate electrode 2 and the connection wire 4.

Specifically, first, molybdenum (Mo) is deposited on the substrate 1, such as a glass substrate, to 0.2 μm thick by sputtering using an argon (Ar) gas, thereby forming a gate metal film (not shown). During the formation of the gate metal film, the temperature of the substrate 1 is 200 to 300° C.

Then, a resist pattern film (not shown) is formed of a photoresist material on the gate metal film. The resist pattern film is used as a mask for patterning of the gate metal film (photolithography step). As a result, the gate electrode 103 of the thin film transistor 301 and the gate electrode 2, the conductive layer 3, and the connection wire 4 of the diode 201 are obtained. The etching of the gate metal film may be, for example, wet etching. The etchant used herein may be a solution that is composed of 10 to 80 weight % of phosphoric acid, 1 to 10 weight % of nitric acid, 1 to 10 weight % of acetic acid, and water that constitutes the remaining part of the solution. After the end of the etching, the resist pattern film is removed using a peeling solution which contains an organic alkali.

The material of the gate metal film is not limited to molybdenum (Mo) but may be indium tin oxide (ITO), a simple metal of tungsten (W), copper (Cu), chromium (Cr), tantrum (Ta), aluminum (Al), titanium (Ti), or the like, a nitride or oxide of the simple metal, or an alloy of the simple metal which contains another metal. The gate metal film may be a single layer made of the above material or may have a layered structure. For example, the gate electrode 2 may be a layered film containing titanium and aluminum, e.g., a Ti/Al/Ti layered film. Alternatively, it may be a layered film containing titanium and copper, e.g., a Ti/Cu/Ti layered film, or a layered film containing copper and molybdenum, e.g., a Mo/Cu/Mo layered film.

The formation method of the gate metal film may be a method different from sputtering, e.g., a deposition method. The thickness of the gate metal film is not limited to any particular thickness. The etching method of the gate metal film is not limited to the above-described wet etching. For example, dry etching may be employed using a combination of a chlorine ($Cl_2$) gas and a boron trichloride ($BCl_3$) gas, a $CF_4$ (carbon tetrafluoride) gas, $O_2$ (oxygen), etc.

(2) Gate Insulating Layer/Semiconductor Layer Formation Step 72:

Next, a gate insulating layer 5, a microcrystalline silicon film, and an $n^+$ type silicon film are formed in this order on the gate electrode 2, the conductive layer 3, and the connection wire 4, and the microcrystalline silicon film and the $n^+$ type silicon film are patterned, whereby island-like microcrystalline silicon processed films 118, 17, 18 and $n^+$ type silicon processed films 120, 19, 20 are obtained as shown in FIGS. 4(a) and 4(b). Thereafter, a contact hole 14 is formed in the gate insulating layer 5 such that part of the connection wire 4 is exposed.

Specifically, first, on the substrate 1 on which the gate electrode 2 has been formed, a gate insulating layer 5 (e.g., 0.4 μm thick) is formed of silicon nitride ($SiN_x$) by plasma enhanced chemical vapor deposition (PECVD). In the present embodiment, the formation of the gate insulating layer 5 is performed in a film formation chamber which has an electrode structure of a parallel plate type (capacitively-coupled type) under the conditions that the substrate temperature is 250 to 300° C., the pressure is 50 to 300 Pa, and the power density is 10 to 20 mW/cm². The gas used herein for the film formation is a mixture gas of silane ($SiH_4$), ammonium ($NH_3$), and nitrogen ($N_2$).

Then, a microcrystalline silicon film (e.g., 0.12 μm thick) is formed using the same film formation chamber that is used for formation of the gate insulating layer 5. In the present embodiment, the formation of the microcrystalline silicon film is performed under the conditions that the substrate temperature is 250 to 300° C., the pressure is 50 to 300 Pa, and the power density is 1 to 30 mW/cm² with the use of a silane gas which is diluted with a hydrogen gas as the film formation gas. The flow rate ratio of silane ($SiH_4$) and hydrogen ($H_2$) is 1:200 to 1:1000.

Then, an $n^+$ type silicon film (e.g., 0.05 μm thick) is formed using the above-described film formation chamber. In the present embodiment, formation of the n⁺ type silicon film is performed in generally the same way as the formation of the microcrystalline silicon film, except that a mixture gas of silane (SiH₄), hydrogen (H₂), and phosphine (PH₃) is used as the film formation gas.

Thereafter, a resist pattern film (not shown) is formed of a photoresist material on the gate insulating layer 5. This resist pattern film is used as a mask for patterning of the microcrystalline silicon film and the n⁺ type silicon film (photolithography step). As a result, island-like microcrystalline silicon processed films 118, 17, 18 and n⁺ type silicon processed films 120, 19, 20 are obtained. The etching method used herein for the etching of the microcrystalline silicon films and the n⁺ type silicon films is, for example, dry etching mainly using a chlorine (Cl₂) gas. After the end of the etching, the resist pattern film is removed using a peeling solution which contains an organic alkali.

Then, a resist pattern film (not shown) is formed of a photoresist material. This resist pattern film is used as a mask for formation of a contact hole 14 in the gate insulating layer 5 (photolithography step). The formation of the contact hole 14 may be realized by means of dry etching with the use of a combination of, for example, a CF₄ (carbon tetrafluoride) gas, O₂ (oxygen), etc. After the end of the etching, the resist pattern film is removed using a peeling solution which contains an organic alkali.

(3) Source/Drain Electrode Formation Step 73:

On the n⁺ type silicon processed films 120, 19, 20 and the gate insulating layer 5, a conductive film for formation of source and drain electrodes is formed. In the present embodiment, molybdenum is deposited by sputtering with the use of an argon (Ar) gas on a surface of the substrate 1 to 0.2 μm thick, whereby a conductive film (e.g., 0.2 μm thick) is formed. The substrate temperature during the formation of the conductive film is 200 to 300° C.

Thereafter, referring to FIGS. 5(a) and 5(b), a resist pattern film 21 is formed on the conductive film. The resist pattern film 21 is used as a mask to pattern the conductive film, thereby forming the source electrode 110 and the drain electrode 112 of the thin film transistor 301 and the source electrode 10, the intermediate electrode 11, and the drain electrode 12 of the diode 201.

The patterning of the conductive film can be performed using, for example, a wet etching method. In the present embodiment, the etchant used is a solution that is composed of 10 to 80 weight % of phosphoric acid, 1 to 10 weight % of nitric acid, 1 to 10 weight % of acetic acid, and water that constitutes the remaining part of the solution. Part of the resist pattern film 21 extending over the source electrode 10, the intermediate electrode 11, and the drain electrode 12 is not removed after the end of the etching and is remaining in the resultant structure subjected to the next step.

The material of the conductive film is not limited to molybdenum (Mo) but may be indium tin oxide (ITO), a simple metal of tungsten (W), copper (Cu), chromium (Cr), tantrum (Ta), aluminum (Al), titanium (Ti), or the like, a nitride or oxide of the simple metal, or an alloy of the simple metal which contains another metal. The source electrode 10 may be a single layer made of the above material or may have a layered structure. For example, the conductive film may be a layered film containing titanium and aluminum, e.g., a Ti/Al/Ti layered film. Alternatively, it may be a layered film containing titanium and copper, e.g., a Ti/Cu/Ti layered film, or a layered film containing copper and molybdenum, e.g., a Mo/Cu/Mo layered film.

The formation method of the conductive film may be a method different from sputtering, e.g., a deposition method. The formation method of the conductive film is not limited to the wet etching with the use of the above-described etchant. The thickness of the conductive film is not limited to the above-identified thickness.

(4) Source/Drain Separation Step 74:

Subsequently, part of the n⁺ type silicon processed film 120 which is not covered with the source electrode 110 or the drain electrode 112 is removed, whereby the gap portion 116 is formed as shown in FIGS. 6(a) and 6(b). Likewise, part of the n⁺ type silicon processed films 19, 20 which is not covered with the source electrode 10, the intermediate electrode 11, or the drain electrode 12 is removed, whereby the gap portions 15, 16 are formed. In this process, part of the microcrystalline silicon processed films 118, 17, 18 corresponding to the gap portions 116, 15, 16 become thinner than the other part due to overetching. As a result, the microcrystalline silicon layer 107 and the contact layers 109a, 109b are obtained from the microcrystalline silicon processed film 118 and the n⁺ type silicon processed film 120, respectively. Likewise, the microcrystalline silicon layers 6, 7 and the contact layers 8a, 8b, 9a, 9b are obtained from the microcrystalline silicon processed films 17, 18 and the n⁺ type silicon processed films 19, 20, respectively. After the etching, the resist pattern film 21 (FIGS. 5(a) and 5(b)) is removed.

In the present embodiment, the etching of the n⁺ type silicon processed films 120, 19, 20 may be dry etching with the use of a chlorine (Cl₂) gas. After the end of the etching, the resist pattern film 21 is removed using a peeling solution which contains an organic alkali. The etching method is not limited to the above-described method.

(5) Passivation Formation Step 75:

Then, the passivation 13 is formed of silicon nitride (SiN$_x$) so as to cover the source electrode 110, the drain electrode 112, and the gap portion 116 of the thin film transistor 301 and their surroundings, and the source electrode 10, the intermediate electrode 11, the drain electrode 12, and the gap portions 15, 16 of the diode 201 and their surroundings. Thus, the semiconductor device shown in FIGS. 1(a) and 1(b) is obtained.

Specifically, the passivation 13 (e.g., 0.3 μm thick) is formed of silicon nitride (SiN$_x$) by plasma enhanced chemical vapor deposition (PECVD). In the present embodiment, the formation of the passivation 13 is performed in a film formation chamber which has an electrode structure of a parallel plate type (capacitively-coupled type) under the conditions that the substrate temperature is 200° C., the pressure is 50 to 300 Pa, and the power density is 10 to 20 mW/cm². The gas used herein for the film formation is a mixture gas of silane (SiH₄), ammonium (NH₃), and nitrogen (N₂).

Although not shown, when necessary, an opening may be provided in the passivation 13, through which an electric signal, such as a predetermined voltage, is input to the source electrodes 110, 10 and the drain electrodes 112, 12.

Note that, in the example illustrated in FIG. 1, the semiconductor layers (microcrystalline silicon layers 6, 7) and the contact layer 8a, 8b, 9a, 9b have the shape of islands, although they are however not limited to the shape of islands. FIGS. 7(a) and 7(b) are a plan view and a cross-sectional view of another semiconductor device of the present embodiment. For the sake of simplicity, components which are the same as those of FIG. 1 are indicated by the same reference numerals, and the descriptions thereof are herein omitted.

In a diode 202, the pattern of a source electrode 10, an intermediate electrode 11, a drain electrode 12, and source bus lines (not shown), the pattern of contact layers 25a, 25b, 25d, 25e, and the pattern of microcrystalline silicon layers 24a to 24f are generally the same except for gap portions 15, 16. Also, a thin film transistor 302 is provided on the same substrate 1 on which the diode 202 is provided. In the thin film transistor 302, the source and drain electrodes 110, 112, the contact layers 109a, 109b, and the microcrystalline silicon layer 107 have generally equal planar shapes except for the gap portion 116 as in the diode 202.

The diode 202 and the thin film transistor 302 can be fabricated using the same fabrication method that is used for the above-described diode 201 and thin film transistor 301. Note that using half-tone exposure is advantageous in that the number of times of formation of the resist pattern film can be decreased, and that the source materials used for formation of the resist pattern films, such as photoresist materials, can be reduced.

A process that uses half-tone exposure is described in, for example, C. W. Kim et al., SID 2000 DIGEST, pp. 1006-1009. Specifically, on the substrate 1 on which the gate electrode 2, the conductive layer 3, the connection wire 4, the gate electrode 103, and the gate insulating layer 5 have been formed, a microcrystalline silicon film for formation of a microcrystalline silicon layer, an n+ silicon film for formation of a contact layer, and a conductive film for formation of source and drain electrodes are formed in this order. Thereafter, a resist pattern is formed using half-tone exposure. The resist pattern has a thicker portion which corresponds to a part of the conductive film that is supposed to constitute the source and drain electrodes and a thinner portion which corresponds to another part of the conductive film that is supposed to constitute the gap. Then, the resist pattern is used as a mask to pattern the conductive film, the n+ silicon film, and the microcrystalline silicon film (first process). Then, the thickness of the entire resist pattern is reduced by dry etching, for example, such that the thinner portion of the resist pattern is removed to form an opening. Thereafter, the resist pattern in which the opening has been formed is used as a mask to pattern the conductive film and the n+ silicon film (second process). In this way, the same resist pattern is used to pattern the conductive film, the n+ silicon film, and the microcrystalline silicon film. From these films, the source electrode 10, the intermediate electrode 11, the drain electrode 12, the contact layers 25a, 25b, 25d, 25e, and the microcrystalline silicon layers 24a to 24f of the diode 202, and the source electrode 110, the drain electrode 112, the contact layers 109a, 109b, and the microcrystalline silicon layer 107 of the thin film transistor 302 can be formed.

In the diode 202, formation of the opening in the passivation 13 and formation of the opening in the gate insulating layer 5 are concurrently performed in the same step. Therefore, the connection wire 4 and the source electrode 10 are electrically coupled together via an upper electrode 23. Note that the upper electrode 23 can be formed of ITO (indium tin oxide) or the like. Alternatively, it may be formed using an IZO film. When the present embodiment is applied to an active matrix substrate, the upper electrode 23 may be concurrently formed with the formation of pixel electrodes (not shown).

Note that, in the diode 201 also, formation of the opening in the passivation 13 and formation of the opening in the gate insulating layer 5 may be concurrently performed in the same step, and a contact hole 22 may be provided such that the connection wire 4 and the source electrode 10 may be coupled together via the upper electrode 23.

Figure 8:
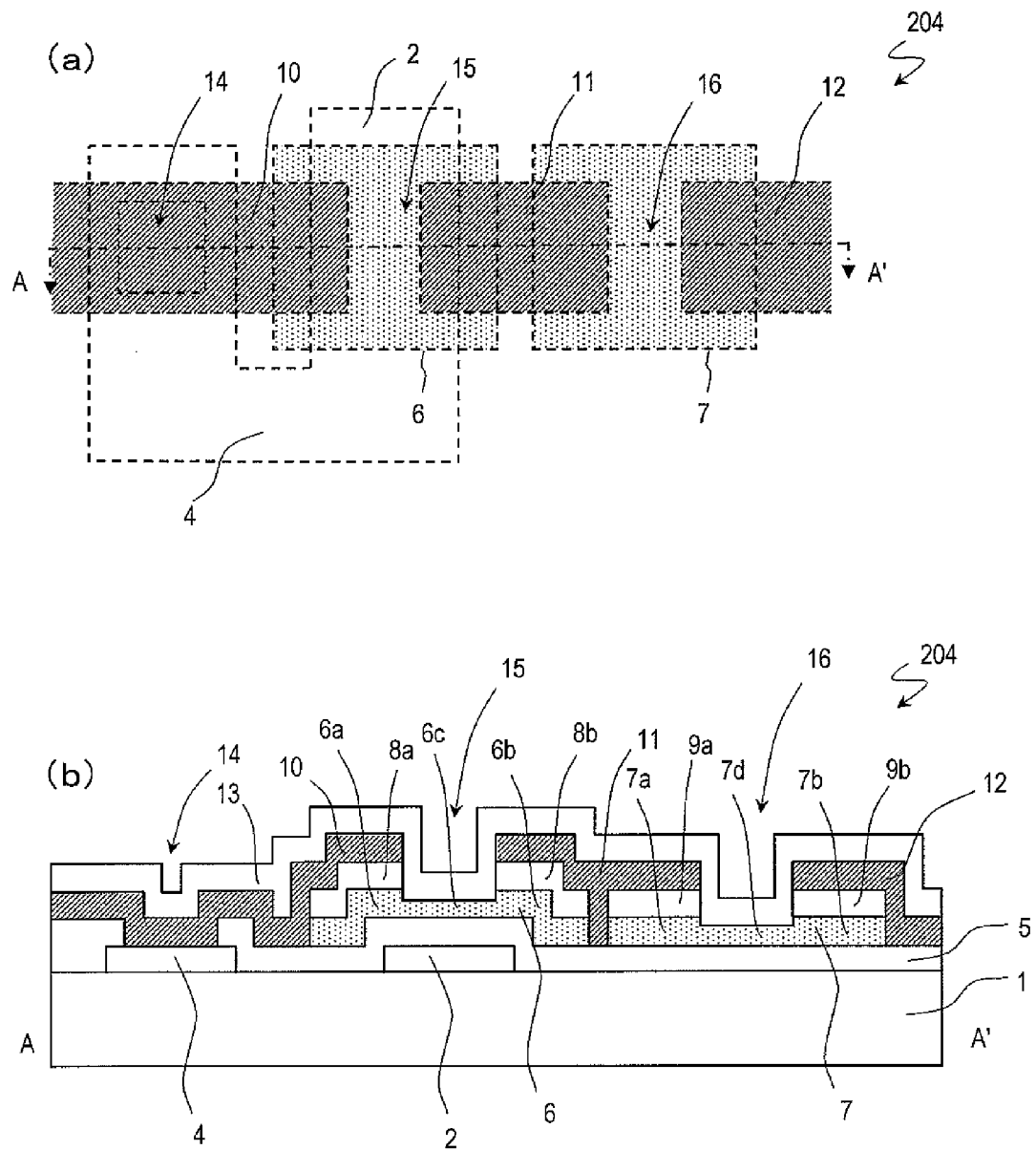
FIG. 8(a) is a plan view of another example of a diode of embodiment 1. (b) is a cross-sectional view taken along line A-A' of (a).

In the present embodiment, the diodes 201, 202 may not have the conductive layer 3. FIGS. 8(a) and 8(b) are a plan view and a cross-sectional view showing an alternative structure of the diode of the present embodiment. A diode 204 has the same structure as that of the diode 201 shown in FIG. 1 except that the conductive layer 3 is not provided under the microcrystalline silicon layer 7. In the diode 204 also, part of the microcrystalline silicon layer 7 which forms an electric current path functions as a resistor, so that the same effects as those of the diode 201 can be obtained.

In the present embodiment, the diode may have an electric current path including the channel region and the resistor region of the semiconductor layer when the diode is in an ON state. The configuration of the diode is not limited to those shown in FIG. 7 and FIG. 8. For example, the diode may include a microcrystalline silicon layer which is constituted of three or more islands. Even in this case, the same effects as those described above can be achieved so long as the diode includes a channel region in which at least one microcrystalline silicon layer does not extend above the gate electrode, and another microcrystalline silicon layer extends above the gate electrode.

Also, the configuration of the thin film transistor is not limited to those shown in FIG. 1 and FIG. 7. The thin film transistors 301, 302 shown in FIG. 1 and FIG. 7 each include one gate electrode 103. However, each of them may include a plurality of gate electrodes. In this case, islands of the microcrystalline silicon layer may be provided on respective ones of the gate electrodes, or a single piece of microcrystalline silicon layer may extend over the plurality of gate electrodes. Alternatively, as will be described later in detail, a plurality of channel regions may be formed in a microcrystalline silicon layer that is provided on one gate electrode.

Embodiment Examples and Comparative Examples

The present inventor(s) fabricated sample elements E1 to E3 as examples of the diode of the present embodiment and sample elements C1 to C6 as comparative examples and evaluated the diode characteristics of these sample elements. The evaluation procedure and results are described below.

(i) Structures of Sample Elements of Embodiment Examples and Comparative Examples The sample elements E1 to E3 of the embodiment examples have the same structure as that of the diode 201 shown in FIG. 1. The sample elements C1 to C6 of the comparative examples have a different structure from that of the diode 201 shown in FIG. 1 in that the semiconductor layer that functions as a resistor does not exist between the source and drain electrodes 10, 12.

A schematic plan view and a cross-sectional view of the sample elements C1 to C6 of the comparative examples are shown in FIGS. 9(a) and 9(b), respectively. For the sake of simplicity, components which are the same as those of the diode 201 shown in FIG. 1 are indicated by the same reference numerals. The sample elements C1 to C6 of the comparative examples do not include the conductive layer 3, the microcrystalline silicon layer 7, or the intermediate electrode 11. The microcrystalline silicon layer 6 includes a channel region 6c which is arranged so as to extend above the gate electrode 2, and first and second regions 6a, 6b which are provided at the opposite sides of the channel region 6c. The first region 6a is connected to the source electrode 10 while the second region 6b is connected to the drain electrode 12. The entirety of part of the microcrystalline silicon layer 6 which is to constitute the electric current path extends above the gate electrode 2.

(ii) Fabrication Method of Sample Elements of Embodiment Examples and Comparative Examples The sample elements E1 to E3 of the embodiment examples are fabricated using the method which has been previously described with reference to FIG. 2 to FIG. 6, except that the pattern sizes of the gate electrode 2, the conductive layer 3, the microcrystalline silicon layers 6, 7, and the respective electrodes 10, 11, 12 are adjusted as described below.

The structure of the sample elements E1 to E3 is shown in FIG. 10(a). In this structure, the distance between the source electrode 10 and the intermediate electrode 11 in a plane which is parallel to the surface of the substrate 1 (substrate plane), L, represents the length of the channel region ("channel length"). The distance between the intermediate electrode 11 and the drain electrode 12, $L_R$, represents the length of part of the microcrystalline silicon layer 7 which is to serve as a resistor (or "resistor region"). The length $L_R$ is referred to as "resistor region length" for the sake of distinguishment from the channel length L. The length of the microcrystalline silicon layers 6, 7 along a direction perpendicular to the channel length L and the resistor region length $L_R$, W, is referred to as "channel width". The respective electrodes 10, 11, 12 all have equal widths, which are smaller than the channel width W.

In the sample element E1, the channel length L is 3 μm, the resistor region length $L_R$ is 3 μm, and the channel width W is 10 μm. With respect to a direction parallel to the channel length L, the length of overlapping areas of the respective electrodes 10, 11, 12 with the gate electrode 2 or the conductive layer 3, L', is 2 μm. The length of overlapping areas of the respective electrodes 10, 11, 12 with the microcrystalline silicon layers 6, 7 is 2×L'. With respect to a direction perpendicular to the channel length L, the respective electrodes 10, 11, 12 are positioned at the middle of the microcrystalline silicon layers 6, 7. The distance between the edges of the microcrystalline silicon layers 6, 7 and the edges of the respective electrodes 10, 11, 12, W', is 2 μm. Thus, the width of the respective electrodes 10, 11, 12 is W−2×W'.

In the sample element E2, the channel length L is 10 μm, and the resistor region length $L_R$ is 10 μm. The channel width W, the length L', and the length W' are equal to those of the sample element E1.

In the sample element E3, the channel length L is 20 μm, and the resistor region length $L_R$ is 20 μm. The channel width W, the length L', and the length W' are equal to those of the sample element E1.

The sample elements C1 to C5 of the comparative examples are also fabricated using the method which has been previously described with reference to FIG. 2 to FIG. 6, except that the conductive layer 3, the microcrystalline silicon layer 7, and the intermediate electrode 11 are not formed.

The structure of the sample elements C1 to C5 is shown in FIG. 10(b). In the sample element C1, the pattern sizes of the gate electrode 2, the microcrystalline silicon layer 6, the source electrode 10, and the drain electrode 12 are adjusted such that the channel length L is 3 μm. Likewise, the channel length L of the sample element C2 is 10 μm, the channel length L of the sample element C3 is 20 μm, the channel length L of the sample element C4 is 50 μm, and the channel length L of the sample element C5 is 100 μm. Note that the channel width W, the length L', and the length W' of these sample elements C1 to C5 are equal to those of the sample elements E1 to E3 of the embodiment examples.

The sample element C6 of the comparative example has the same structure as the other sample elements C1 to C5 and fabricated using the same method, except that a semiconductor layer which is to form the active layer of the sample element C6 is formed by an amorphous silicon film instead of the microcrystalline silicon film. In the sample element C6, the pattern sizes of the gate electrode, the gate electrode, the amorphous silicon layer, the source electrode, and the drain electrode are adjusted such that the channel length L is 3 μm.

Figure 9:
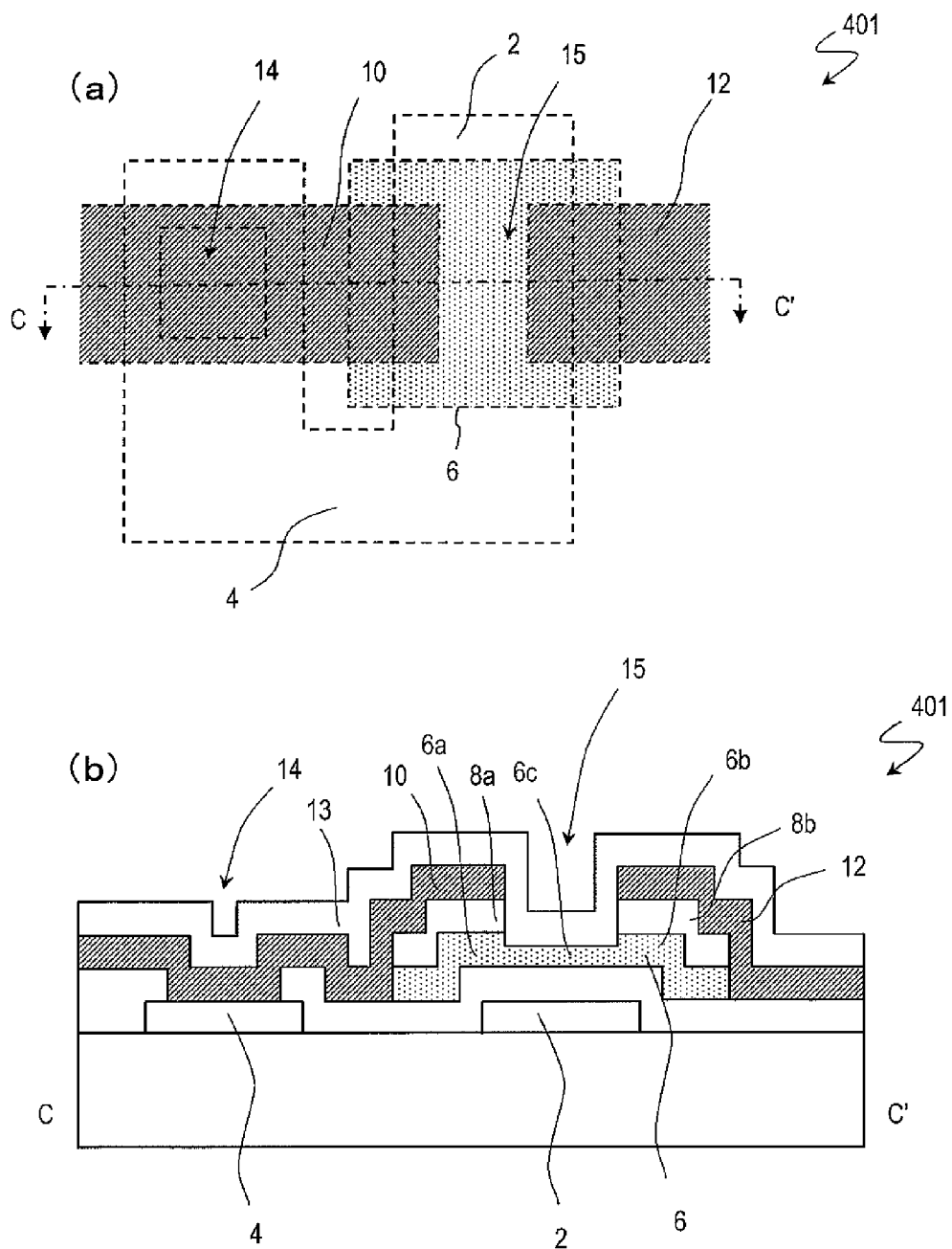
FIGS. 9(a) and (b) are a plan view and a cross-sectional view schematically showing sample elements C1 to C6 of the comparative examples.

Note that, when a TFT such as shown in FIG. 9 is fabricated using the microcrystalline silicon film that was used in the sample elements E1 to E3 and C1 to C5, the mobility is about 0.6 to 0.8 cm²/Vs. When the amorphous silicon film used in the sample element C6 is used, the mobility is about 0.3 to 0.4 cm²/Vs under the same conditions.

(iii) Diode Characteristics of Sample Elements of Embodiment Examples and Comparative Examples The diode characteristics of the sample elements E1 to E3 and C1 to C6 which were fabricated using the above-described method were measured. Here, the electric current flowing between the source electrode 10 and the drain electrode 12 (drain current) Isd was measured with the voltage applied between the source electrode 10 and the drain electrode 12 (inter-terminal voltage) Vgd is varying.

The measurement results are shown in FIG. 11(a). In the graph shown in FIG. 11(a), the abscissa axis represents the inter-terminal voltage Vgd (V) where the flow of the drain current Isd from the source electrode 10 to the drain electrode 12 is indicated by "positive". The ordinate axis represents the drain current Isd (A). FIG. 11(b) shows the structure of the sample elements C1 to C6 of the comparative examples. FIG. 11(c) shows the structure of the sample elements E1 to E3 of the embodiment examples.

When used as a short ring diode of the active matrix substrate, the respective diodes preferably have diode characteristics which are substantially equal to those of the sample element C6 (the channel length L: 20 μm) which was fabricated using the amorphous silicon.

In the conventional structure, if the amorphous silicon is replaced by the microcrystalline silicon while the channel length L (20 μm) is maintained equal to that of the sample element C6, i.e., in the sample element C3, the drain current excessively flows as shown in FIG. 11(a). To obtain characteristics which are substantially equal to those of the sample element C6 under the condition that the microcrystalline silicon is used, the channel length L is increased to 50 μm as in the sample element C4. However, the increase of the channel length L leads to an increase in size of the diode, resulting in an enlarged frame region of the display panel. Note that, when a microcrystalline silicon film of a higher mobility is used, the necessity of further increasing the channel length L arises. Thus, this problem becomes of greater importance.

On the other hand, it is seen that, according to the structure of the present embodiment, for example, by adjusting the dimensions such that the channel length L is 3 μm and the resistor region length $L_R$ is 3 μm as in the sample element E1, diode characteristics which are substantially equal to those of the sample element C6 can be realized. Therefore, characteristics which are suitable to the short ring diode can be realized, even with the use of microcrystalline silicon, while the size of the element is maintained substantially equal to that of the sample element C6. It is also seen that, by adjusting the channel length L and the resistor region length $L_R$ when necessary, desired characteristics can be realized while the size of the diode is maintained to a small size.

As clearly seen from the measurement results, according to the present embodiment, especially excellent effects are obtained when TFTs and diodes are formed using a semiconductor film of microcrystalline silicon which has higher mobility than amorphous silicon. This is because their characteristics can be optimized while the characteristics of TFTs are increased, without increasing the size of the diodes.

Although the mobility of the TFTs is 0.6 to 0.8 cm$^2$/Vs in the example illustrated herein, especially excellent effects are achieved when the mobility of the TFTs is higher than 1 cm$^2$/Vs.

Note that, in the thin film transistors 301, 302 and the diodes 201, 202, 204 of the present embodiment, an amorphous silicon layer or a polycrystalline silicon layer may be used as the active layer in place of the microcrystalline silicon layer. Alternatively, a film formed of a metal oxide semiconductor, such as a Zn—O based semiconductor (ZnO) film, an In—Ga—Zn—O based semiconductor (IGZO) film, an In—Zn—O based semiconductor (IZO) film, a Zn—Ti—O based semiconductor (ZTO) film, or the like, may be used as the active layer. In this case, the contact layers 25a, 25b, 25d, 25e, 109a, 109b are unnecessary, so that the active layer and the source and drain electrodes can establish a direct electric connection. Especially when the metal oxide semiconductor used is IGZO, the mobility exceeds 4 cm$^2$/Vs, and therefore, higher effects can be achieved by applying the present invention.

Figure 15:
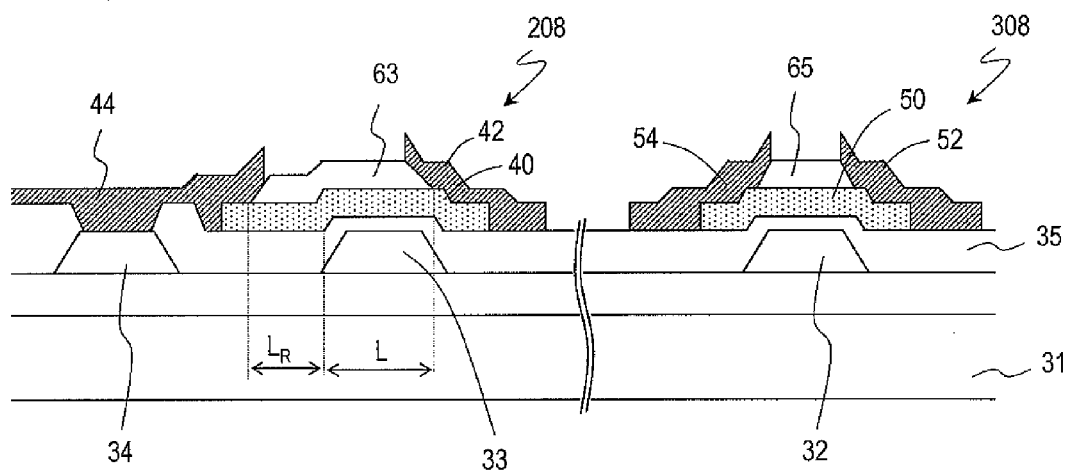
FIG. 15 A schematic cross-sectional view of another semiconductor device of embodiment 4 of the present invention.

The thin film transistors 301, 302 and the diodes 201, 202, 204 of the present embodiment are inverted staggered channel etching type TFTs which have a bottom gate structure, or diodes which are based on that configuration. However, they may be inverted staggered etch stop type TFTs or diodes which are based on that configuration. Specifically, they may have an etch stop layer on the semiconductor layer as shown in FIG. 15. It is however desirable that a contact layer of n$^+$ type silicon or the like is provided between the semiconductor layer and the source and drain electrodes.

Embodiment 2

Hereinafter, embodiment 2 of a semiconductor device of the present invention is described with reference to the drawings. The semiconductor device of the present embodiment is different from embodiment 1 shown in FIG. 1 in that one island-like semiconductor layer is used for formation of a diode.

Figure 12:
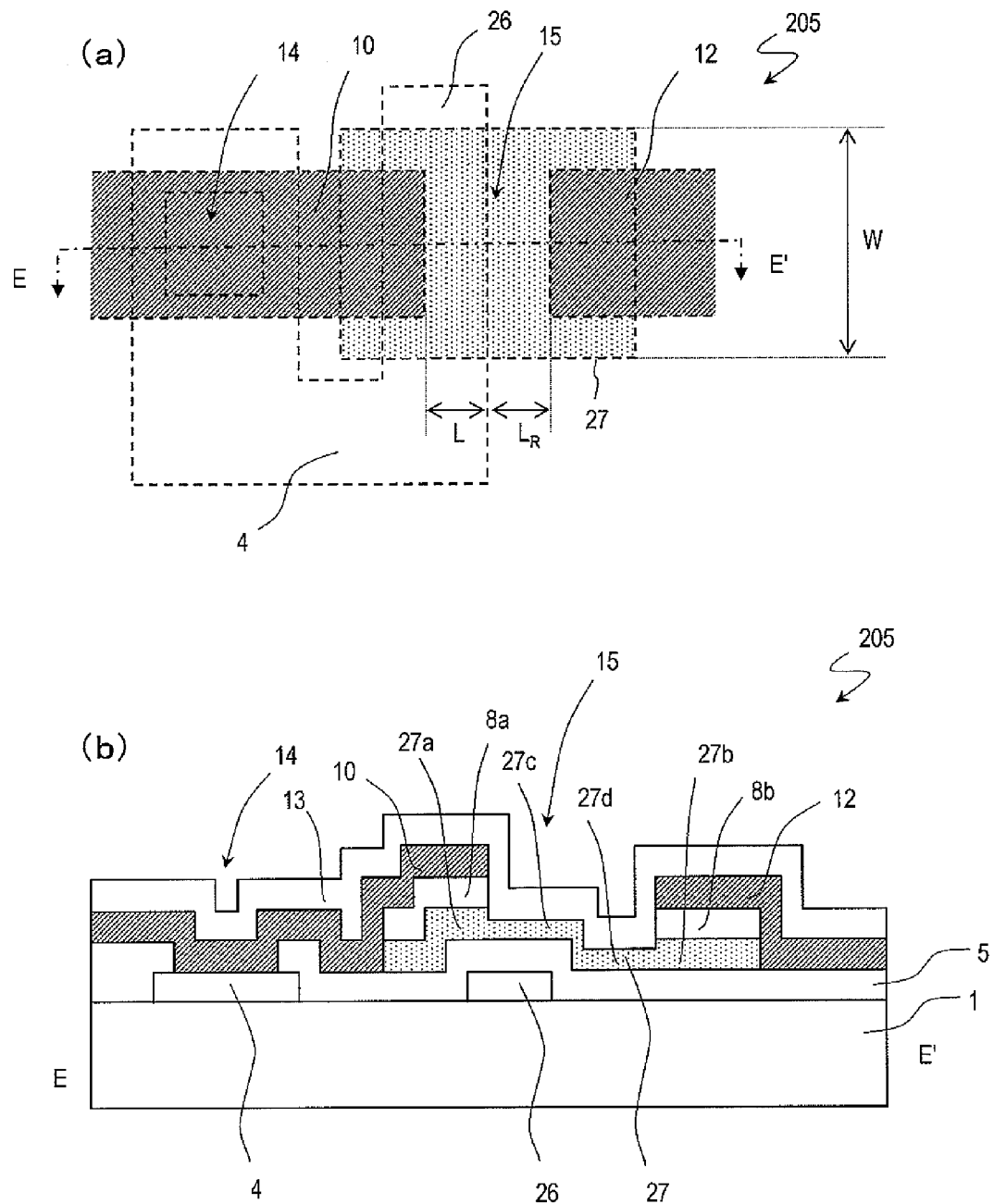
FIG. 12(a) is a plan view schematically showing a diode of embodiment 2 of the present invention. (b) is a cross-sectional view taken along line E-E' of (a).

FIG. 12 schematically shows a diode of the present embodiment. FIG. 12(*a*) is a plan view of the diode of the present embodiment. FIG. 12(*b*) is a cross-sectional view taken along line E-E' of FIG. 12(*a*). For the sake of simplicity, components which are the same as those of the diode 201 shown in FIG. 1 are indicated by the same reference numerals, and the descriptions thereof are herein omitted.

The diode 205 is based on an inverted staggered channel etching type TFT which has a bottom gate structure, and has such a configuration that the gate electrode and the source electrode are coupled together. Although not shown, the semiconductor device of the present embodiment further includes a diode TFT. This TFT may include an active layer that is formed of a microcrystalline silicon film which is the same as a microcrystalline silicon layer 27 of the diode 205. For example, it may have the same configuration as that of the thin film transistor 301 shown in FIGS. 1(*a*) and 1(*b*).

The diode 205 includes a substrate 1, such as a glass substrate, a gate electrode 26 provided on the substrate 1, a gate insulating layer 5 which is provided on the substrate 1 so as to cover the gate electrode 26, a microcrystalline silicon layer 27 which is provided on the gate insulating layer 5, a source electrode 10 which is provided above the microcrystalline silicon layer 27 with the intervention of the contact layer 8a therebetween, and a drain electrode 12 which is provided above the microcrystalline silicon layer 27 with the intervention of the contact layer 8b therebetween.

The microcrystalline silicon layer 27 includes a channel region 27c, and first and second regions 27a, 27b which are provided at the opposite sides of the channel region 27c. The first region 27a is electrically coupled to the source electrode 10 via the contact layer 8a. The second region 27b is electrically coupled to the drain electrode 12 via the contact layer 8b.

The channel region 27c is arranged so as to extend above the gate electrode 26. The conductivity of the channel region 27c can be controlled according to the voltage applied to the gate electrode 26. The microcrystalline silicon layer 27 includes a portion 27d which extends between the first and second regions 27a, 27b and which does not extend above the gate electrode 26 (resistor region 27d). The resistor region 27d functions as a resistor because its resistance does not decrease even when a voltage is applied to the gate electrode 26. The lengths of the channel region 27c and the resistor region 27d along the channel direction, L, L$_R$, are adjusted when necessary. For example, when the channel width W is 10 μm, the length of the channel region 27c, channel length L, is 3 μm, and the length of the resistor region 27d, L$_R$, is 3 μm. Note that, in the present embodiment, the second region 27b does not extend above the gate electrode 26 and therefore functions as a resistor.

In the present embodiment, the contact layers 8a, 8b, the source electrode 10, and the drain electrode 12 are patterned such that they do not extend above the channel region 27c or the resistor region 27d. Thus, there is a gap portion 15 above the channel region 27c and the resistor region 27d.

In the present embodiment, the gate electrode 26, the connection wire 4, and the gate electrode of the TFT (not shown) are formed of the same conductive film. The gate electrode 26 is connected to the connection wire 4. The connection wire 4 is electrically coupled to the source electrode 10 in a contact hole 14 which is an opening formed in the gate insulating layer 5.

Note that the materials of the microcrystalline silicon layer 27, the contact layers 8a, 8b, and the passivation 13 of the diode 205 may be the same as those of corresponding components of the diode 201 shown in FIG. 1.

In the diode 205, an electric current flows mainly between the source electrode 10 and the drain electrode 12. On the same substrate on which the diode 205 is provided, the device has a structure that is based on an inverted staggered channel etching type TFT which has a bottom gate structure, and in which the gate electrode and the source electrode are coupled together. In this structure, the electric current flows from the source electrode 10 and passes through the contact layer 8a and then flows through the first region 27a, the channel region 27c, the resistor region 27d, and the second region 27b of the microcrystalline silicon layer 27. Thereafter, the electric current flows through the contact layer 8b to reach the drain electrode 12.

In the present embodiment also, as in the above-described embodiment, the gate electrode 26 does not extend under the resistor region 27d and the second region 27b of the microcrystalline silicon layer 27 so that electrons, which are movable charges, are not accumulated even when a voltage is applied to the gate electrode 26. Thus, the resistor region 27d and the second region 27b are not substantially affected by the potential of the gate electrode and therefore have high resistance. Such a high resistance region 27d is provided in the microcrystalline silicon layer 15 such that an electric current is unlikely to flow between the source electrode 10 and the drain electrode 12, whereby characteristics which are suitable to uses of the diode 205 can be realized.

Note that the diode of the present embodiment may include at least one semiconductor layer which has both the channel region 270 and the resistor region 27d. For example, the diode of the present embodiment may include two or more semiconductor layers of such a configuration. In this case, the two or more semiconductor layers may be coupled to each other via an intermediate electrode which is provided on the semiconductor layers.

The semiconductor device of the present embodiment can be fabricated using the method which has been previously described with reference to FIG. 2 to FIG. 6.

The diode 205 of the present embodiment is a diode that is based on an inverted staggered channel etching type TFT which has a bottom gate structure, but may alternatively be a diode that is based on an inverted staggered etch stop type TFT. Specifically, the diode 205 may include an etch stop layer on the semiconductor layer as shown in FIG. 15. It is however desirable that a contact layer of $n^+$ type silicon or the like is provided between the semiconductor layer and the source and drain electrodes.

Embodiment 3

Hereinafter, embodiment 3 of a semiconductor device of the present invention is described with reference to the drawings. The semiconductor device of the present embodiment is different from embodiment 1 shown in FIG. 1 in that two gate electrodes are provided under the semiconductor layer of the diode and that an intermediate electrode is not provided between the source and drain electrodes of the diode.

FIG. 13 schematically shows a diode of the present embodiment. FIG. 13(a) is a plan view of the diode of the present embodiment. FIG. 13(b) is a cross-sectional view taken along line F-F' of FIG. 13(a). For the sake of simplicity, components which are the same as those of the diode 201 shown in FIG. 1 are indicated by the same reference numerals, and the descriptions thereof are herein omitted.

The diode 206 is based on an inverted staggered channel etching type TFT which has a bottom gate structure, and has such a configuration that the gate electrode and the source electrode are coupled together. Although not shown, the semiconductor device of the present embodiment further includes a staggered channel etching type TFT which has a bottom gate structure on the same substrate on which the diode 206 is provided. This TFT may include an active layer that is formed of a microcrystalline silicon film which is the same as a microcrystalline silicon layer of the diode 206. For example, it may have the same configuration as that of the thin film transistor 301 shown in FIGS. 1(a) and 1(b).

The diode 206 includes a substrate 1, such as a glass substrate, gate electrodes 2, 29 which are provided on the substrate 1 and which are mutually separated with a space therebetween, a gate insulating layer 5 which is provided on the substrate 1 so as to cover the gate electrodes 2, 29, a microcrystalline silicon layer 30 which is provided on the gate insulating layer 5, a source electrode 10 which is provided above the microcrystalline silicon layer 30 with the intervention of the contact layer 8a therebetween, and a drain electrode 12 which is provided above the microcrystalline silicon layer 30 with the intervention of the contact layer 9b therebetween. The gate electrode 2 and the gate electrode 29 are electrically coupled to a connection electrode 4 and to the source electrode 10 in the contact hole 14.

The microcrystalline silicon layer 30 includes channel regions 30c, 30e, a resistor region 30d interposed between the channel regions 30c, 30e, and first and second regions 30a, 30b which are provided at the opposite sides of the channel regions 30c, 30e. The first region 30a is electrically coupled to the source electrode 10 via the contact layer 8a. The second region 30b is electrically coupled to the drain electrode 12 via the contact layer 9b.

The channel region 30c is arranged so as to extend above the gate electrode 2. The conductivity of the channel region 30c can be controlled according to the voltage applied to the gate electrode 2. Likewise, the channel region 30e is arranged so as to extend above the gate electrode 29. The conductivity of the channel region 30e can be controlled according to the voltage applied to the gate electrode 29. Meanwhile, the resistor region 30d does not extend above the gate electrodes 2, 29. Therefore, the resistance of the resistor region 30d does not decrease even when a voltage is applied to these gate electrodes 2, 29, and thus, the resistor region 30d functions as a resistor.

The lengths of the channel regions 30c, 30e and the resistor region 30d along the channel direction, $L_1, L_2, L_R$ are adjusted when necessary. For example, when the channel width W is 10 μm, the total length of the channel regions 30c, 30e (channel length L: $L=L_1+L_2$) is 6 μm, and the length of the resistor region 30d (resistor region length) $L_R$ is 3 μm.

Note that the materials of the microcrystalline silicon layer 30, the contact layers 8a, 9b, and the passivation 13 of the diode 206 may be the same as those of corresponding components of the diode 201 shown in FIG. 1.

In the diode 206, an electric current flows mainly between the source electrode 10 and the drain electrode 12. Here, the electric current flows from the source electrode 10 and passes through the contact layer 8a and then flows through the first region 30a, the channel region 30c, the resistor region 30d, the channel region 30e, and the second region 30b of the microcrystalline silicon layer 30 in this order. Thereafter, the electric current flows through the contact layer 9b to reach the drain electrode 12.

In the present embodiment also, as in the above-described embodiment, the gate electrodes 2, 29 do not extend under the resistor region 30d of the microcrystalline silicon layer 30. Thus, the resistor region 30d is not substantially affected by the potential of the gate electrodes 2, 29 and therefore has high resistance. Such a high resistance region 30d is provided in the microcrystalline silicon layer 30 such that an electric current is unlikely to flow between the source electrode 10 and the drain electrode 12, whereby characteristics which are suitable to uses of the diode 205 can be realized.

The semiconductor device of the present embodiment can be fabricated using the method which has been previously described with reference to FIG. 2 to FIG. 6.

The diode 206 of the present embodiment is a diode that is based on an inverted staggered channel etching type TFT which has a bottom gate structure, but may alternatively be a diode that is based on an inverted staggered etch stop type TFT. Specifically, the diode 206 may include an etch stop layer on the semiconductor layer as shown in FIG. 15. It is however desirable that a contact layer of $n^+$ type silicon or the like is provided between the semiconductor layer and the source and drain electrodes.

Embodiment 4

Hereinafter, embodiment 4 of a semiconductor device of the present invention is described with reference to the drawings. The semiconductor device of the present embodiment is different from the above-described embodiments in that the active layer of a diode and a thin film transistor is formed using an In—Ga—Zn—O based semiconductor (IGZO) film and that a contact layer is not included.

Figure 14:
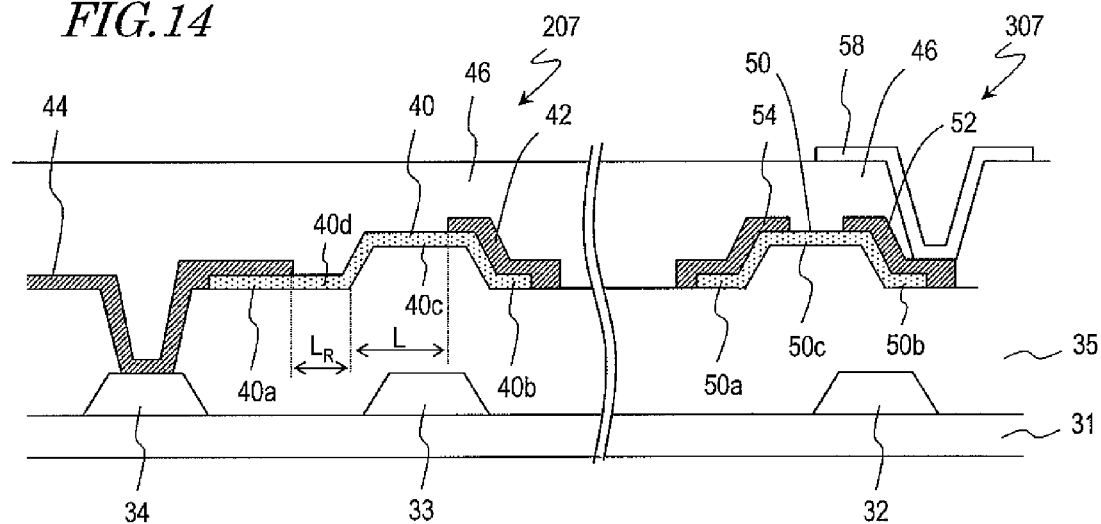
FIG. 14 A schematic cross-sectional view of a semiconductor device of embodiment 4 of the present invention.

FIG. 14 is a schematic cross-sectional view of a semiconductor device of the present embodiment. The semiconductor device includes a substrate 31, and a diode 207 and a thin film transistor 307 which are provided on the substrate 31. The diode 207 and the thin film transistor 307 are formed using the same IGZO film. The thin film transistor 207 is an inverted staggered channel etching type TFT which has a bottom gate structure. The diode 307 is based on an inverted staggered channel etching type TFT which has a bottom gate structure and has such a configuration that the gate electrode and the source electrode are coupled together.

The thin film transistor 207 includes a gate electrode 32 provided on the substrate 31, a gate insulating layer 35 which is provided so as to cover the gate electrode 32, an IGZO layer 50 provided on the gate insulating layer 35, and a source electrode 54 and a drain electrode 52 which are provided on the IGZO layer 50.

The IGZO layer 50 includes a channel region 50c, and a source region 50a and a drain region 50b which are provided on the opposite sides of the channel region 50c. The source region 50a is in contact with the source electrode 54. The drain region 50b is in contact with the drain electrode 52.

The diode 207 includes a gate electrode 33 and a connection wire 34 which are provided on the substrate 31, the gate insulating layer 35 which are provided so as to cover the gate electrode 33 and the connection wire 34, an IGZO layer 40 which is provided on the gate insulating layer so as to extend above the gate electrode 33 a first electrode (source electrode) 44 which is provided on the IGZO layer 40, and a second electrode (drain electrode) 42 which is provided on the IGZO layer 40.

The IGZO layer 40 includes a channel region 40c, and first and second regions 40a, 40b which are provided on the opposite sides of the channel region 40c. The channel region 40c is arranged so as to extend above the gate electrode 33. The conductivity of the channel region 40c can be controlled according to a voltage applied to the gate electrode 33. The first region 40a is electrically coupled to the source electrode 44. The second region 40b is in contact with the drain electrode 42.

The IGZO layer 40 further includes a portion 40d which extends between the first and second regions 40a, 40b and which does not extend above the gate electrode 33 (resistor region 40d). The resistor region 40d has high resistance irrespective of the voltage applied to the gate electrode 33 and therefore functions as a resistor. Note that, in the present embodiment, the first region 40a also does not extend above the gate electrode 33. Therefore, the first region 40a also functions as a resistor.

In the present embodiment, the gate electrodes 32, and the connection wire 34 are formed of the same conductive film. The gate electrode 33 is connected to the connection wire 34. The connection wire 34 is electrically coupled to the source electrode 44 in a contact hole which is an opening formed in the gate insulating layer 35.

The IGZO layers 50, 40 in the thin film transistor 307 and the diode 207 are formed of the same IGZO film. The IGZO film is a film which contains, for example, In, Ga and Zn in the ratio of In:Ga:Zn=2:2:1. Note that the IGZO film may be replaced by another metal oxide semiconductor film.

In the present embodiment, a passivation 46 is provided over the electrodes 52, 54, 42, 44 in the thin film transistor 307 and the diode 207. On the passivation 46, a pixel electrode 58 is provided. The pixel electrode 58 is electrically coupled to the drain electrode 52 in a contact hole formed in the passivation 46.

The semiconductor device of the present embodiment is fabricated, for example, as described below.

First, a conductive film, such as a molybdenum (Mo) film, is formed on the substrate 31 by sputtering. This conductive film is patterned by wet etching or dry etching, whereby the gate electrodes 32, 33 and the connection wire 34 are formed.

Then, a silicon nitride (SiNx) film is formed by PECVD as the gate insulating layer 35. The thickness of the gate insulating layer 35 is, for example, 450 nm. An opening is formed in the gate insulating layer 35 such that the surface of the connection wire 34 is partially exposed. Note that, as the gate insulating layer 35, a silicon oxide (SiOx) film may be used in place of the SiNx film. Alternatively, a multilayer film constituted of a SiOx film and a SiNx film may be used.

An IGZO film (e.g., 70 nm thick) is formed by sputtering on the gate insulating layer 35 and in the opening of the gate insulating layer 35 and patterned to form the IGZO layers 40, 50.

Then, a conductive film, such as a Mo film, by sputtering so as to cover the IGZO layers 40, 50 and patterned, whereby the drain electrodes 42, 52 and the source electrodes 44, 54 are obtained. In this step, the patterning may be realized by wet etching or may be realized by dry etching. When wet etching is employed, a surface portion of the channel regions 40c, 50c of the IGZO layers 40, 50 is also etched away. Thus, the thickness of the channel regions 40c, 50c is about 55 nm.

Then, a silicon oxide (SiOx) film is formed by PECVD as the passivation 46. The thickness of the passivation 46 is, for example, 200 nm. An opening is formed in the passivation 46 such that the surface of the source electrode 52 is partially exposed.

Thereafter, an IZO film is formed on the passivation 46 and in the opening of the passivation 46 and patterned to form the pixel electrode 58. In this way, the diode 207 and the thin film transistor 307 are obtained.

When the channel width of the thin film transistor 307 is 30 μm and the channel length L is 4 μm, the mobility of the thin film transistor 307 is for example 4.2 cm$^2$/Vs, the threshold value is about −1.3 V, and the S value is about 0.9 (V/dec). The channel width of the diode 207 is 30 μm, and the channel length L is 3 μm, and the resistor region length $L_R$ is 3 μm. Note that the lengths L, $L_R$ of the diode 207 are adjusted as necessary according to the use of the diode 207.

The structure of the semiconductor device of the present embodiment is not limited to the structure shown in FIG. 14. For example, an etch stop layer may be provided on the IGZO layer of the thin film transistor and the diode.

FIG. 15 is a schematic cross-sectional view which illustrates the structure of a semiconductor device in which an etch stop layer is provided on the semiconductor layer. For the sake of simplicity, components which are the same as those shown in FIG. 14 are indicated by the same reference numerals, and the descriptions thereof are herein omitted.

In the semiconductor device shown in FIG. 15, after an IGZO layer 40, 50 (50 nm thick) has been formed, an etch stop layer is formed so as to cover the IGZO layers 40, 50. Then, the etch stop layer is patterned to obtain an etch stop layer 63 that is in contact with part of the IGZO layer 40 which is to form the channel region and the resistor region, and an etch stop layer 65 that is in contact with part of the IGZO layer 50 which is to form the channel region. Thereafter, source and drain electrodes 44, 42, 54, 52 are formed.

In this structure, in the etching step for forming the source and drain electrodes 44, 42, 54, 52, the surface portions of the channel regions of the IGZO layers 40, 50 are prevented from being etched away. Therefore, the thickness of the channel regions of the IGZO layers 40, 50 can be ensured, and damage to the surface of the channel regions due to etching can be prevented.

Examples of the material of the etch stop layers 63, 65 include SiOx and photosensitive acrylic resins. Note that, although not shown, a passivation may be provided so as to cover the source and drain electrodes 44, 42, 54, 52 and the etch stop layers 63, 65. An insulating layer (e.g., SiOx layer) may be formed on the surface of the substrate 31 such as a glass substrate, and the gate electrodes 32, 33 may be formed on the insulating layer. Alternatively, the IGZO layers 40, 50 may be provided with a gate electrode on both the substrate side and the opposite side (upper surface side).

When the channel width of a thin film transistor 308 is 25 μm and the channel length L is 10 μm, the mobility of the thin film transistor 308 is, for example, about 8 cm$^2$/Vs, the threshold value is about 1 V, and the ON/OFF current ratio is $2.0 \times 10^7$ or higher. The channel length L and the resistor region length $L_R$ of the diode 208 are adjusted when necessary according to the uses of the diode 208. When the channel width of the diode 208 is 25 μm, both the channel length L and the resistor region length $L_R$ may be 3 μm.

Note that the diodes 207, 208 shown in FIG. 14 and FIG. 15 include one semiconductor layer (IGZO layer) which includes a channel region and a resistor region. The diodes 207, 208 may include a plurality of IGZO layers which are arranged such that at least one of the IGZO layers does not extend above the gate electrode as in the diode 201 shown in FIG. 1.

Embodiment 5

Hereinafter, embodiment 5 of a semiconductor device of the present invention is described with reference to the drawings. The present embodiment is an active matrix substrate which includes a plurality of thin film transistors that function as switching elements and a plurality of diodes that form a short ring. The active matrix substrate of the present embodiment is suitably used in a display device, such as a liquid crystal display devices, an organic electroluminescence (EL) display device, or the like.

FIG. 16(a) is a schematic cross-sectional view of a liquid crystal display device in which the active matrix substrate of the present embodiment is used. FIG. 16(b) is a top view schematically showing the active matrix substrate of FIG. 16(a).

As shown in FIG. 16(a), the liquid crystal display device includes an active matrix substrate 82, a counter substrate 83 which is provided so as to oppose the active matrix substrate 82, and a liquid crystal layer 84 provided between these substrates 82, 83. The liquid crystal layer 84 is sealed by a sealant 89 provided between the active matrix substrate 82 and the counter substrate 83. Although not shown, a surface of the counter substrate 83 on the liquid crystal layer side is provided with a color filter and a counter electrode.

Surfaces of the active matrix substrate 82 and the counter substrate 83 on the liquid crystal layer side are respectively provided with alignment films 87a, 87b. The rear side of the active matrix substrate 82 and the viewer side of the counter substrate 83 are respectively provided with polarizers 88a, 88b.

As shown in FIG. 16(b), the active matrix substrate includes a plurality of pixel electrodes 85 which are arranged separate from one another and each of which defines a pixel, i.e., a unit of displaying of images, thin film transistors 86 which are provided in respective pixels and which function as switching elements, source bus lines 86s which are coupled to the pixel electrodes 85 via the thin film transistors 86, and gate bus lines 86g for selectively driving the thin film transistors 86. Although not shown, the source bus lines 86s and the gate bus lines 86g are connected to source terminals and gate terminals, respectively, through which predetermined external signals are to be input.

As the thin film transistors 86, the thin film transistors 301, 302, 307, 308 of embodiments 1 to 4 which have been previously described can be used. The pixel electrodes 85 may be formed using an electrically-conductive material which is capable of transmitting light, such as ITO (indium tin oxide), IZO, etc., or an electrically-conductive material which is capable of reflecting light, such as aluminum, a silver alloy, etc.

Further, a plurality of diodes 90A, 90B are provided in a region of the active matrix substrate 82 surrounding the display region in which the pixel electrodes are arranged (frame region). The diodes 90A, 90B are formed using the same semiconductor film as the thin film transistors 86. The semiconductor layer (not shown) includes a gate electrode 92 which resides under the semiconductor layer, and a source electrode 94 and a drain electrode 96 which are provided on the semiconductor layer. The gate electrode 92 and the source electrode 94 are electrically coupled to each other via a contact hole 98. As the diodes 90A, 90B, the diodes 201, 202, 204 to 208 of embodiments 1 to 4 which have been previously described can be used.

The source electrode 94 of the diodes 90A, 90B is electrically coupled to any one of the source bus lines 86s. The drain electrode 96 is electrically coupled to another one of the source bus lines 86s. The diodes 90A, 90B are arranged such that electric currents are likely to flow in opposite directions from each other. This arrangement enables the charges on the electrified source bus lines 86s to be discharged in both directions. Therefore, electrostatic damage can be prevented more effectively. Note that only either one of the diodes 90A, 90B may be provided.

In the illustrated example, the diodes 90A, 90B are interposed between adjacent ones of the source bus lines 86s. However, the diodes 90A, 90B may be interposed between adjacent ones of the gate bus lines 86g.

Figure 17:
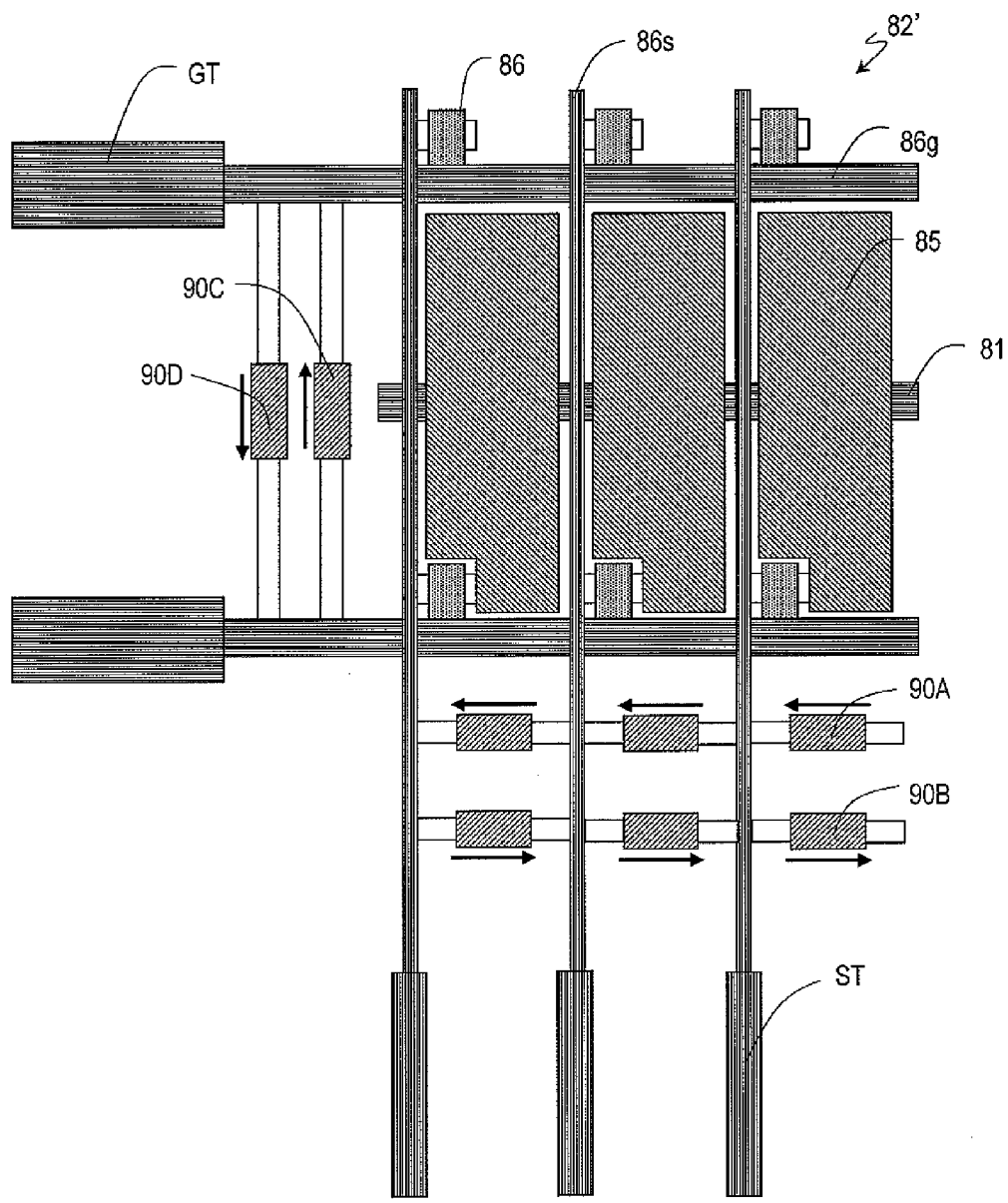
FIG. 17 A top view schematically showing another active matrix substrate of embodiment 5 of the present invention.

FIG. 17 is a schematic top view of another example of the active matrix substrate of the present invention.

The example shown in FIG. 17 is different from the structure of the active matrix substrate 82 shown in FIG. 16(b) in that diodes (90C, 90D) are provided not only between adjacent ones of the source bus lines 86s but also between adjacent ones of the gate bus lines 86g. For the sake of simplicity, components which are the same as those of the active matrix substrate 82 are indicated by the same reference numerals, and the descriptions thereof are herein omitted.

The active matrix substrate 82' includes gate terminals GT and source terminals ST through which predetermined external electric signals are input, a plurality of gate bus lines 86g which are connected to the gate terminals GT, source bus lines 86s which are connected to the source terminals ST, and an auxiliary capacitance line 81 which is formed of the same material as the gate bus lines 86g. Diodes 90A, 90B are interposed between adjacent ones of the source bus lines 86s. Diodes 90C, 90D are interposed between adjacent ones of the gate bus lines 86g. The diodes 90A, 90B are arranged such that electric currents are likely to flow in opposite directions from each other. The diodes 90C, 90D are arranged such that electric currents are likely to flow in opposite directions from each other. The structure of the diodes 90A to 90D is the same as that of the diodes 90A, 90B which has been previously described with reference to FIG. 16(b).

Thus, by providing the diodes 90A to 90D both between the source bus lines 86s and between the gate bus lines 86g, more effective countermeasures for electrostatic protection can be realized.

In the active matrix substrate 82', every one of the bus lines 86s, 86g is coupled to any of the diodes 90A to 90D. In the present embodiment, however, any one and another one of a plurality of bus lines including the source bus lines 86s and the gate bus lines 86g may be provided with at least one diode therebetween. For example, a diode may be provided between the source bus line 86s and the gate bus line 86g. So long as a diode is thus provided between at least two bus lines, the charge input to either one of the two bus lines can be discharged to the other, so that electrostatic damage can be reduced.

The active matrix substrates 82, 82' of the present embodiment are fabricated using the method which has been previously described with reference to FIG. 2 to FIG. 6. Note that formation of the pixel electrodes 85 can be realized by forming a transparent conductive film of a metal oxide, such as ITO (indium tin oxide), IZO (indium zinc oxide), ZnO (zinc oxide), or the like, and photolithographically patterning the film.

Although not shown, the active matrix substrates 82, 82' may include a driving circuit for driving the respective thin film transistors 86. In this case, a thin film transistor and a diode which are used for the driving circuit may be formed using the same semiconductor film as that of the thin film transistors 86 and the diodes 90A to 90D.

The present embodiment is applicable to a driver monolithic type active matrix substrate in which a driving circuit and the display region are provided on the same substrate.

Figure 18:
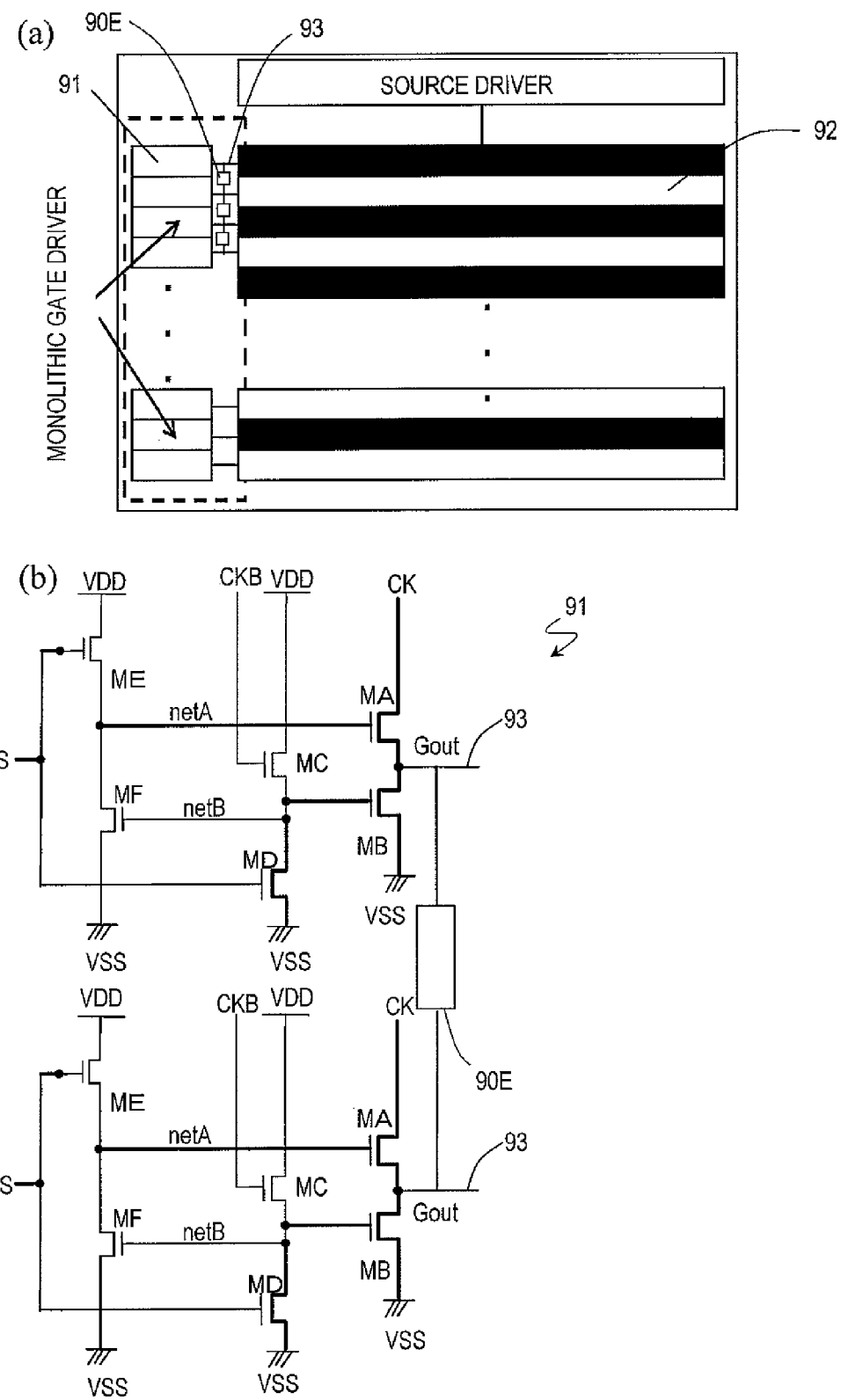
FIG. 18(a) is a plan view schematically showing still another active matrix substrate of embodiment 5 of the present invention. (b) is a circuit diagram of a shift register in a monolithic gate driver shown in (a).

FIG. 18(a) is a plan view schematically showing a gate driver monolithic type active matrix substrate of the present embodiment. FIG. 18(b) is a circuit diagram of a shift register in a gate driver (monolithic gate driver) shown in FIG. 18(a).

As shown, the active matrix substrate includes a display region 92 in which a plurality of pixel electrodes (not shown) are arranged, a monolithic gate driver, and a source driver. Here, the source driver is not a monolithic driver but one that is separately formed of a silicon wafer and then mounted on the substrate. The structure of the display region 92 is substantially equal to that previously described with reference to FIG. 16 and FIG. 17. The source driver is coupled to source bus lines (not shown) of the display region 92.

The monolithic gate driver includes a plurality of shift registers which are configured to sequentially output gate signals $G_{out}$. The shift registers 91 have gate signal output lines 93 through which gate signals $G_{out}$ are output to corresponding gate bus lines (not shown). Although not shown, the gate signal output line 93 of the shift register of the $n^{th}$ stage is connected to a connection line through which a set signal S is input to the shift register of the n+1$^{th}$ stage.

In the present embodiment, a diode 90E is provided between the gate signal output lines 93 of two adjacent stages. As the diode 90E, the diodes 201 to 208 of embodiments 1 to 4 can be used. Thus, device breakdown due to static electricity can be prevented.

Note that thin film transistors used in the shift registers 91, thin film transistors used as switching elements in the display region 92, and the diode 90E may be formed using the same semiconductor film. Some of the thin film transistors used in the shift registers 91 may be substituted with diodes. The substitute diodes may have the same structure as that of any of the diodes 201 to 208 of embodiments 1 to 4.

Embodiment 6

Hereinafter, embodiment 6 of a semiconductor device of the present invention is described with reference to the drawings. The present embodiment is a gate driver circuit which includes a thin film transistor and a diode. The gate driver circuit of the present embodiment is a gate driver monolithic circuit monolithically formed on an active matrix substrate.

Figure 19:
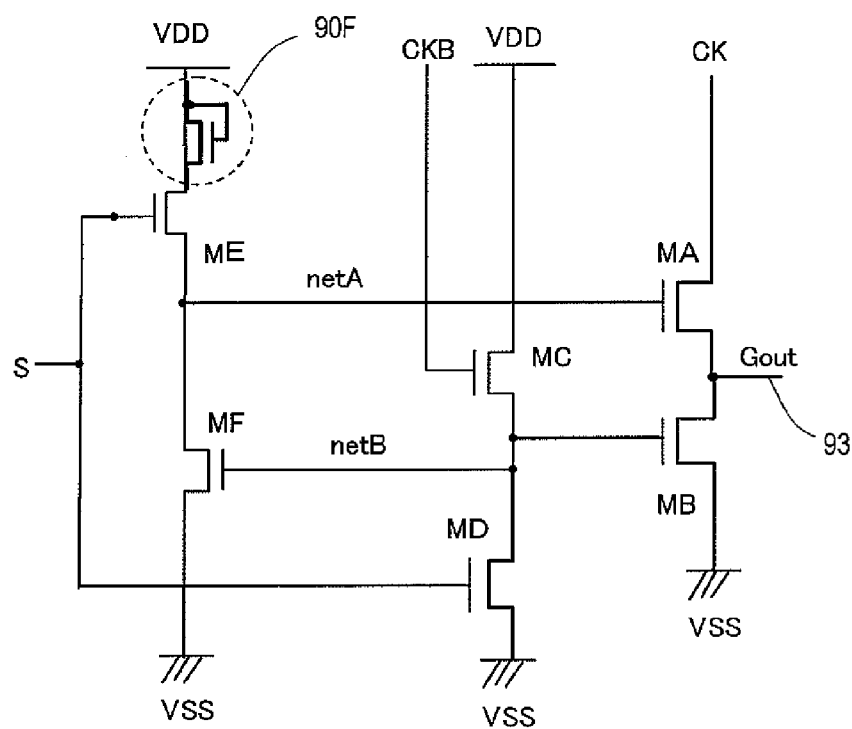
FIG. 19 A diagram illustrating the structure of a gate driver circuit of embodiment 6 of the present invention.
Figure 20:
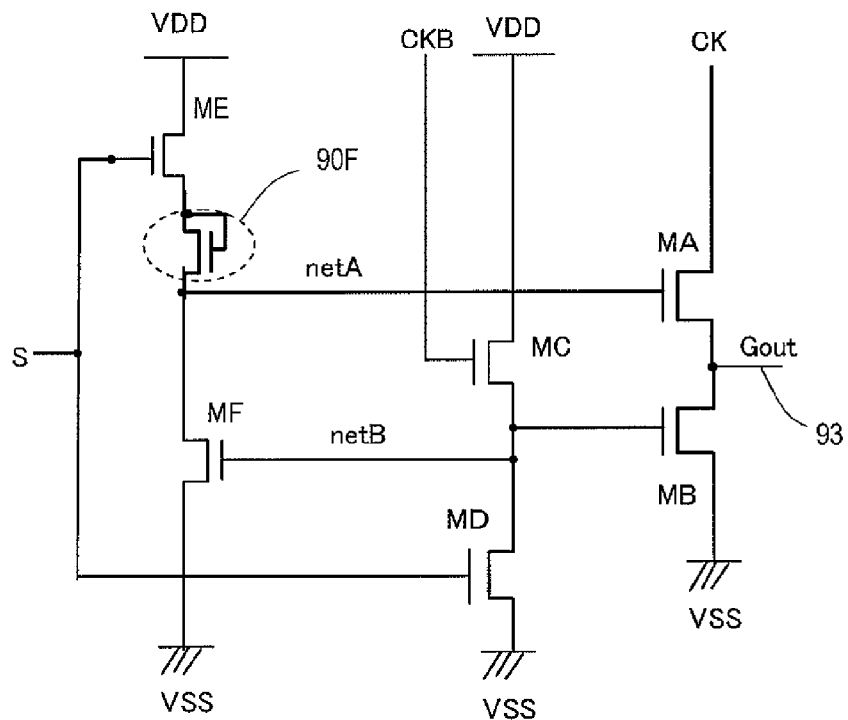
FIG. 20 A diagram illustrating the structure of another gate driver circuit of embodiment 6 of the present invention.
Figure 21:
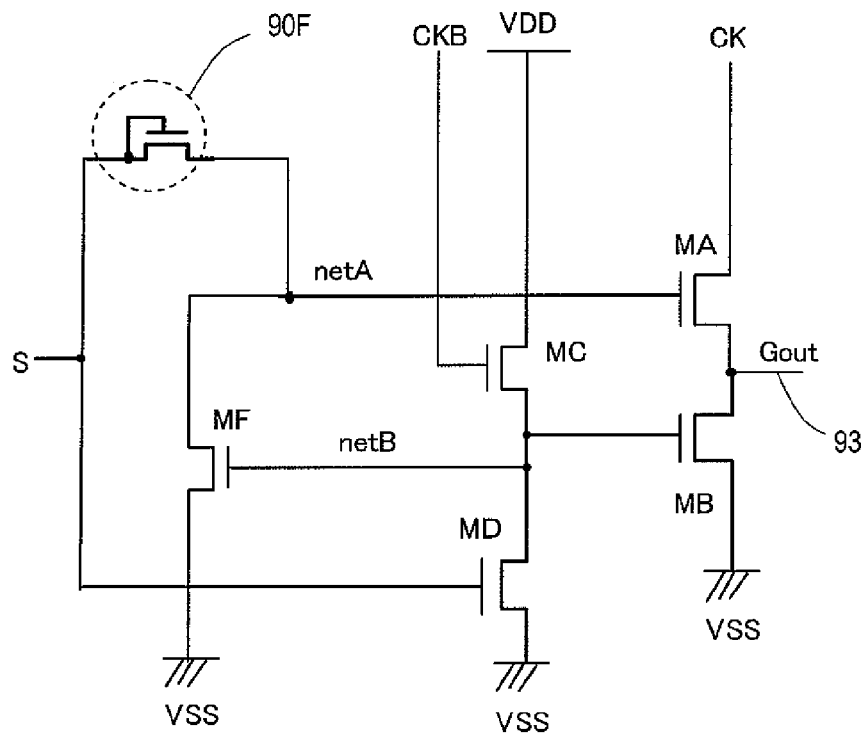
FIG. 21 A diagram illustrating the structure of still another gate driver circuit of embodiment 6 of the present invention.

The gate driver circuit of the present embodiment includes a plurality of shift registers which are configured to sequentially output gate signals. FIG. 19 to FIG. 21 each illustrate the structure of one shift register of the present embodiment.

In the present embodiment, gate signal $G_{out}$ of the shift register is output from the gate signal output line 93 to a corresponding gate bus line. Although not shown, the gate signal output line 93 of the $n^{th}$ stage is connected to a connection line through which a set signal S for the shift register of the n+1$^{th}$ stage is input. VDD and VSS are coupled to external devices and controlled to have potentials which do not substantially vary with time, i.e., constant potentials. VDD is higher than VSS. CK and CKB are externally supplied with clock signals that vary with time, such as rectangular waves. For example, given that VSS is a reference potential (0 V), VDD is 31 V, and CK and CKB vary in the range of 0 V to 31 V with the frequency of 10 kHz to 200 kHz. Note that CK and CKB have opposite phases.

The shift registers each includes a plurality of thin film transistors MA, MB, MC, MD, ME, MF and a diode 90F as shown. At least one of these thin film transistors and the diode 90F are formed using the same semiconductor film. The diode 90F has the same structure as that of any of the diodes 201 to 208 of embodiments 1 to 4 which have been previously described. The diode 90F is provided between VDD or S and a line netA such that the source electrode is coupled to the VDD side or the S side, and the drain electrode is coupled to the line netA side. In other words, the drain electrode of the diode 90F is coupled, directly or via the thin film transistor ME, to the gate electrode of the thin film transistor MA that is the output transistor of the shift register. Here, the drain electrode of the thin film transistor MA is coupled to Gout that directly connects to a gate bus line of the active matrix substrate. In this way, the diode 90F of the present embodiment is provided in a specific direction, unlike embodiment 5 in which two diodes are arranged in opposite directions.

The shift register of the present embodiment uses a boot strap mechanism in its operation in order to increase the output. Specifically, the shift register performs such an operation that, when a signal output from the previous stage enters S, the potential of the line netA (i.e., the line on the gate electrode side of the thin film transistor MA) rises, and at a timing after the rise of the potential of the line netA, the potential of clock CK rises, whereby the potential of the line netA rises due to the capacitive coupling (the coupling of the capacitance between the source electrode and the gate electrode of the thin film transistor MA), and the output of MA that is an output transistor directly coupled to Gout increases.

Here, there is a timing at which the line netA has a higher potential than VDD and S due to the boot strap mechanism. Specifically, this timing occurs when the potential of clock CK rises, i.e., when the shift register allows an electric current to flow to Gout.

In a shift register which has a conventional boot strap mechanism, an electric current may sometimes flow in a reverse direction, from the line netA toward the VDD side or the S side to which the line netA is connected, i.e., an electric current may sometimes leak, at the above timing. The reverse flow of the electric current from the line netA causes the gate electrode potential of the transistor MA to decrease, so that the output to Gout decreases. Thus, there is a probability that the pixel electrode is not normally charged and fails to reach a desired pixel potential. As a result, such problems may arise that normal display cannot be obtained and that the operation of the shift register stops (fails) at a stage.

On the other hand, according to the present embodiment, the diode 90F can prevent an electric current from flowing in a reverse direction, from netA to the VDD side or S side. Thus, the above problems which would occur due to the reverse flow of the electric current from netA can be prevented.

The circuit configuration of the shift register and the location of the diode 90F are not limited to the shown example. The diode 90F of the present embodiment may be provided in a line of a circuit through which an electric current flows in one direction, whereby a reverse flow of the electric current can be prevented.

Figure 22:
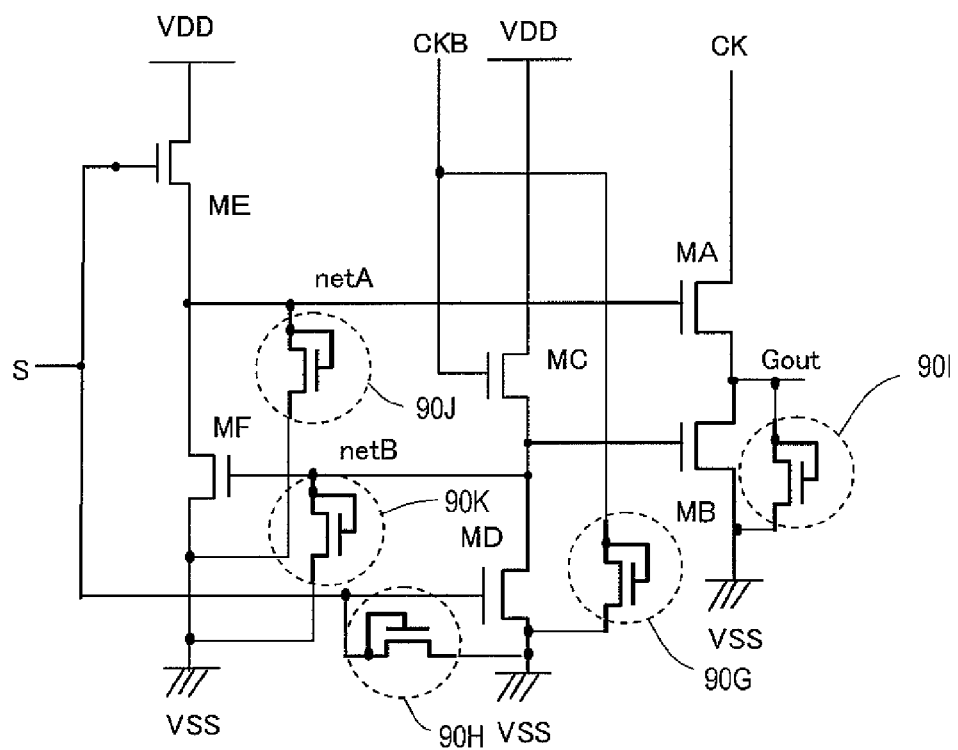
FIG. 22 A diagram illustrating the structure of still another gate driver circuit of embodiment 6 of the present invention.

FIG. 22 shows another structure of a shift register according to the present embodiment. The shift register shown in FIG. 22 includes a plurality of thin film transistors MA, MB, MC, MD, ME, MF and a plurality of diodes 90G, 90H, 90I, 90J, 90K. At least one of these thin film transistors and the diodes 90G to 90K are formed using the same semiconductor film. As the diodes 90G to 90K, the diodes 201 to 208 of embodiments 1 to 4 which have been previously described can be used.

The diode 90G is provided between the terminals of CKB and VSS. It may be provided between the terminals of CK and VSS. Note that CKB and CK are shared among the shift registers of all the stages of the gate driver, and therefore, some of the shift registers may include the diode 90G.

The diode 90H is provided between the terminals of S and VSS. The diode 90I is provided between the terminals of $G_{out}$ and VSS. The diodes 90J and 90K are provided between the line netA and the VSS terminal and between the line netB and the VSS terminal, respectively. These diodes 90H to 90K are preferably provided in every one of the shift registers.

The shown diodes 90G to 90K are arranged such that an electric current flows in one specific direction. These diodes may be combined with other diodes which are arranged in a reverse direction to constitute a diode ring.

Thus, some lines of a driving circuit are coupled to other lines (lines which have the same functions in a shift register of a different stage, power source lines, etc.) via the diode 90G to 90K, whereby electrostatic damage to the shift registers, the clock (CK) lines, and the Gout line can be prevented. Particularly, the diodes 90J, 90K, 90H have their first electrodes connected to lines netA, netB which can be reached only through the thin film transistors. At this site, static electricity readily accumulates especially in operation (during power off), so that it is effective for prevention of damage to the shift registers.

Although an example of application of the present invention to a gate driver circuit has been described above, the present invention is however applicable to a wide variety of circuits which include a thin film transistor and a diode. For example, the present invention may be applied to a source-divided driving circuit such as disclosed in Japanese Laid-Open Patent Publication No. 2005-115342.

Figure 23:
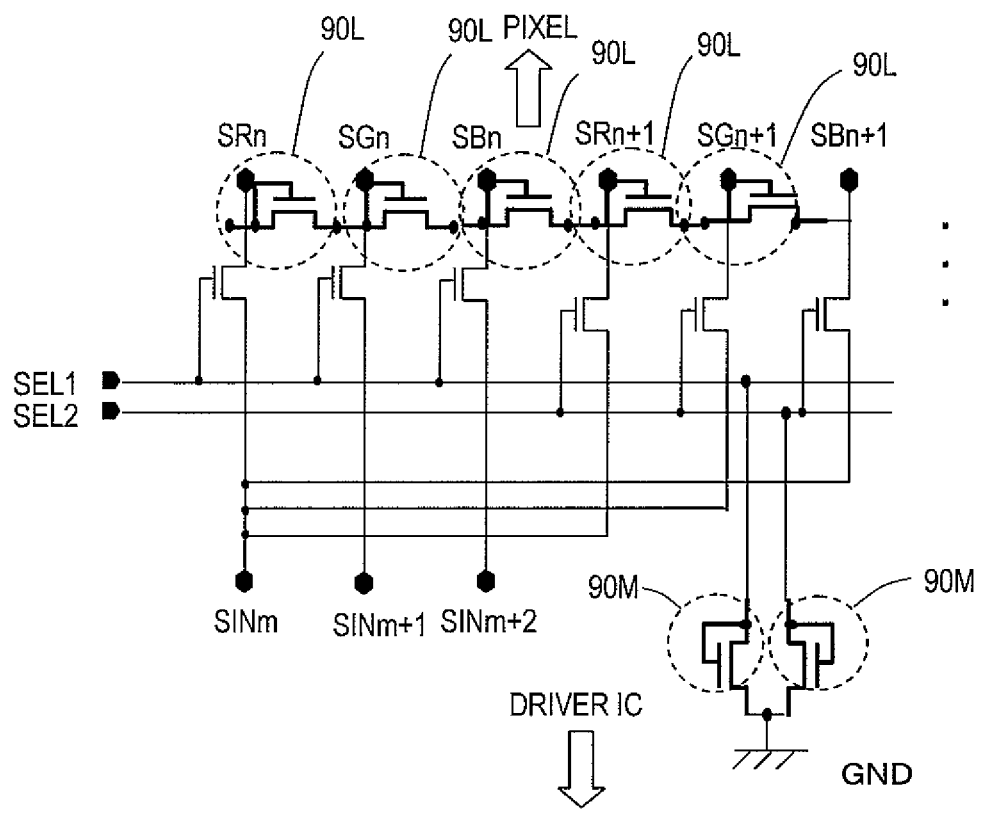
FIG. 23 A diagram illustrating the structure of a source-divided driving circuit of embodiment 6 of the present invention.

FIG. 23 shows an example of a source-divided driving circuit according to the present embodiment. In the shown example, a diode 90L is provided between two adjacent data signal lines SR, SG, SB. A diode 90M is provided between the lines SEL1, SEL2 and the ground. The diodes 90L, 90M are capable of preventing electrostatic damage to the source-divided driving circuit.

The semiconductor device of the present invention is not limited to the above-described embodiments. For example, the diode and the thin film transistor in the present invention may be formed using the same semiconductor film, and the configurations of these elements are not limited to the examples previously described in embodiments 1 to 4. The thin film transistor of the present invention may be a multi-gate structure TFT which includes a plurality of gate electrodes. Alternatively, it may have a configuration in which one semiconductor layer that includes a plurality of channel regions is formed on one gate electrode as shown in FIGS. 24(a) to 24(c). The semiconductor film may include an amorphous silicon film or a polycrystalline silicon film as the active layer instead of a microcrystalline silicon film. Alternatively, a film formed of a metal oxide semiconductor, such as a Zn—O based semiconductor (ZnO) film, an In—Ga—Zn—O based semiconductor (IGZO) film, an In—Zn—O based semiconductor (IZO) film, a Zn—Ti—O based semiconductor (ZTO) film, or the like, may be used as the active layer.

The thin film transistor 303 shown in FIGS. 24(a) to 24(c) is different from the thin film transistor 301 shown in FIG. 1 in that an intermediate electrode 111 is provided between the source electrode 110 and the drain electrode 112. For the sake of simplicity, components which are the same as those of the thin film transistor 301 are indicated by the same reference numerals, and the descriptions thereof are herein omitted.

In the thin film transistor 303, part of a semiconductor layer 107 (intermediate region 107f) is electrically coupled to the intermediate electrode 111 via a contact layer 109f. Therefore, portions of the semiconductor layer 107 extending between the intermediate region 107f and the source and drain regions 109a, 109b, i.e., portions $107c_1$, $107c_2$, constitute channel regions. In such a structure, for example, the OFF current can advantageously be reduced as compared with a configuration which includes a plurality of gate electrodes, because the intermediate electrode 111 extends above the gate electrode 103.

INDUSTRIAL APPLICABILITY

A semiconductor device of the present invention is applicable to a wide variety of devices which has thin film transistors, including circuit substrates, such as active matrix substrates and the like, display devices, such as liquid crystal display devices, organic electroluminescence (EL) display devices, inorganic electroluminescence display devices, and the like, imaging devices, such as flat panel type X-ray image sensor devices and the like, and electronic devices, such as image entry devices, fingerprint readers, and the like. In particular, it is advantageously applied to, for example, liquid crystal display devices with high display quality, such as double-speed driving display devices, liquid crystal display devices with low power consumption, and liquid crystal display devices of larger sizes.

REFERENCE SIGNS LIST 1 substrate
2, 103 gate electrode
3 conductive layer
4 connection wire
5 gate insulating layer
6, 7, 107 semiconductor layer (microcrystalline silicon layer)
6c, 107c channel region
7d resistor region
6a, 6b, 7a, 7b regions of semiconductor layer
107a source region
107b drain region
8a, 8b, 9a, 9b, 109a, 109b contact layer
10, 110 source electrode 12, 112 drain electrode
13 passivation
14 contact hole
15, 16, 116 gap portion
201, 202, 204, 205, 206, 207, 208 diode
301, 302 thin film transistor

The invention claimed is:

1. A semiconductor device, comprising a substrate, and a thin film transistor and a diode which are provided on the substrate, wherein
the diode includes
a gate electrode provided on the substrate,
a gate insulating layer provided on the gate electrode,
at least one semiconductor layer provided on the gate insulating layer, the at least one semiconductor layer including a first region, an intermediate region, and a second region,
a first electrode provided on the first region, the first electrode being electrically coupled to the first region and the gate electrode,
a second electrode provided on the second region, the second electrode being electrically coupled to the second region, and
an intermediate electrode provided in the intermediate region between the first region and the second region, the intermediate electrode being electrically coupled to the intermediate region,
the at least one semiconductor layer includes a channel region between the first region and the intermediate region which extends above the gate electrode with the gate insulating layer intervening therebetween, and a resistor region which does not extend above the gate electrode with the gate insulating layer intervening therebetween,
the resistor region is arranged between the intermediate region and the second region and is arranged such that the resistor region is not overlapped by any of the first electrode, the intermediate electrode, or the second electrode, and
when the diode is in an ON state, an electric current path is defined from the first electrode, through the intermediate electrode, and into the second electrode, the electric current path including the channel region and the resistor region.

2. The semiconductor device of claim 1, wherein
the diode further includes a conductive layer which is provided between the substrate and the gate insulating layer and which is separated from the gate electrode, and
the resistor region is arranged so as to extend above the conductive layer with the intervention of the gate insulating layer therebetween.

3. The semiconductor device of claim 1, wherein
the at least one semiconductor layer is a plurality of semiconductor layers including a first semiconductor layer which includes the first region and a second semiconductor layer which includes the second region,
the intermediate electrode couples the plurality of semiconductor layers in series, and
the plurality of semiconductor layers includes a semiconductor layer which does not extend above the gate electrode.

4. The semiconductor device of claim 1, wherein the at least one semiconductor layer includes one semiconductor layer which includes the first and second regions, the channel region, and the resistor region.

5. The semiconductor device of claim 4, wherein
the diode further includes another gate electrode provided at a position which is closer to the second electrode than the gate electrode is,
the one semiconductor layer further includes another channel region provided at a position which is closer to the second electrode than the channel region is,
the another channel region extends above the another gate electrode with the intervention of the gate insulating layer therebetween, and
the resistor region is provided between the channel region and the another channel region.

6. The semiconductor device of claim 1, wherein the at least one semiconductor layer and the semiconductor layer of the thin film transistor are defined by the same semiconductor film.

7. The semiconductor device of claim 6, wherein the at least one semiconductor layer and the semiconductor layer of the thin film transistor are defined by a microcrystalline silicon film which includes a crystalline phase and an amorphous phase.

8. The semiconductor device of claim 7, wherein a volume fraction of the amorphous phase in the microcrystalline silicon film is not less than 5% and not more than 95%.

9. The semiconductor device of claim 8, wherein the volume fraction of the amorphous phase in the microcrystalline silicon film is not less than 5% and not more than 40%.

10. The semiconductor device of claim 1, wherein the at least one semiconductor layer contains a metal oxide semiconductor.

11. The semiconductor device of claim 1, further comprising a plurality of bus lines, the bus lines including a gate bus line and a source bus line which are in a lattice arrangement on the substrate,
wherein the first electrode of the diode is electrically coupled to any one of the plurality of bus lines, the second electrode of the diode is electrically coupled to another one of the plurality of bus lines.

12. The semiconductor device of claim 1, further comprising a display region which is provided on the substrate and which includes a plurality of pixels, and a driver circuit which is provided on part of the substrate other than the display region,
wherein the driving circuit includes the thin film transistor and the diode.

* * * * *